(12) United States Patent
Zhu et al.

(10) Patent No.: US 12,321,841 B2
(45) Date of Patent: Jun. 3, 2025

(54) UNSUPERVISED CROSS-DOMAIN DATA AUGMENTATION FOR LONG-DOCUMENT BASED PREDICTION AND EXPLANATION

(71) Applicant: International Business Machines Corporation, Armonk, NY (US)

(72) Inventors: Yada Zhu, Irvington, NY (US); Zixuan Yuan, Edison, NJ (US); David Cox, Somerville, MA (US); Anna Wanda Topol, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 17/972,167

(22) Filed: Oct. 24, 2022

(65) Prior Publication Data

US 2024/0185270 A1    Jun. 6, 2024

(51) Int. Cl.
| | |
|---|---|
| *G06F 40/126* | (2020.01) |
| *G06F 40/166* | (2020.01) |
| *G06F 40/30* | (2020.01) |
| *G06N 3/02* | (2006.01) |
| *H03M 7/30* | (2006.01) |

(52) U.S. Cl.
CPC ............. *G06N 3/02* (2013.01); *G06F 40/126* (2020.01); *G06F 40/166* (2020.01); *G06F 40/30* (2020.01); *H03M 7/3082* (2013.01)

(58) Field of Classification Search
CPC ........ G06F 18/23; G06F 40/30; G06F 40/166; G06F 40/126; G06F 40/16; G06Q 30/0202
USPC .......................................................... 706/14
See application file for complete search history.

(56) References Cited

U.S. PATENT DOCUMENTS

| | | | |
|---|---|---|---|
| 11,055,783 B2 | 7/2021 | Trevathan et al. | |
| 11,216,619 B2 | 1/2022 | Yu et al. | |
| 2011/0066644 A1* | 3/2011 | Cooper | .................. G06Q 10/10 |
| | | | 707/E17.108 |
| 2019/0355152 A1* | 11/2019 | Li | .......................... H03M 7/3082 |
| 2021/0043211 A1 | 2/2021 | Leidner et al. | |

(Continued)

FOREIGN PATENT DOCUMENTS

| | | | | |
|---|---|---|---|---|
| CN | 110278444 B | * | 11/2022 | ........... H04N 19/103 |
| WO | WO-2019050968 A1 | * | 3/2019 | |

OTHER PUBLICATIONS

Zixuan Yuan, Yada Zhu, Wei Zhang, Ziming Huang, Guangnan Ye, Hui Xiong, "Multi-Domain Transformer-Based Counterfactual Augmentation for Earnings Call Analysis," arXiv:2112.00963v1 Dec. 2, 2021 (9 pages)—Grace Period Disclosure.

(Continued)

*Primary Examiner* — Patricia H Munson
*Assistant Examiner* — Thea Labogin
(74) *Attorney, Agent, or Firm* — Jordan T. Schiller

(57) ABSTRACT

Unsupervised cross-domain data augmentation techniques for long-text document based prediction and explanation are provided. In one aspect, a system for long-document based prediction includes: an encoder for creating embeddings of long-document texts with hierarchical sparse self-attention, and making predictions using the embeddings of the long-document texts; and a multi-source counterfactual augmentation module for generating perturbed long-document texts using unlabeled sentences from at least one external source to train the encoder. A method for long-document based prediction is also provided.

20 Claims, 15 Drawing Sheets

(56) References Cited

U.S. PATENT DOCUMENTS

| | | | |
|---|---|---|---|
| 2022/0198254 A1* | 6/2022 | Dalli | G06N 3/065 |
| 2022/0231939 A1* | 7/2022 | Mermoud | H04L 41/5025 |
| 2022/0382979 A1* | 12/2022 | Klein | G06F 40/284 |
| 2024/0070403 A1* | 2/2024 | Meng | G06F 40/51 |

OTHER PUBLICATIONS

Zixuan Yuan, Yada Zhu, Wei Zhang, Ziming Huang, Guangnan Ye, Hui Xiong, "Multi-Domain Transformer-Based Counterfactual Augmentation for Earnings Call Analysis," arXiv:2112.00963v2 Dec. 3, 2021 (9 pages)—Grace Period Disclosure.

Zixuan Yuan, Yada Zhu, Wei Zhang, Ziming Huang, Guangnan Ye, Hui Xiong, "Earnings Call Analysis Using a Sparse Attention Based Encoder and Multi-Source Counterfactual Augmentation," Paper ID 415, submitted to KDD '22 on Dec. 1, 2021 (11 pages)—Grace Period Disclosure.

Zixuan Yuan, Yada Zhu, Wei Zhang, Ziming Huang, Guangnan Ye, Hui Xiong, "Earnings Call Analysis Using a Sparse Attention Based Encoder and Multi-Source Counterfactual Augmentation," Paper ID 1629, submitted to TheWebConf2023 on Oct. 1, 2022 (11 pages)—Grace Period Disclosure.

Iz Beltagy et al., "Longformer: The Long-Document Transformer," arXiv:2004.05150v2 (Dec. 2020) (17 pages).

Léon Bottou et al., "Counterfactual Reasoning and Learning Systems: The Example of Computational Advertising," Journal of Machine Learning Research 14, pp. 3207-3260 (Nov. 2013).

Jacob Devlin et al., "Bert: Pre-Training of Deep Bidirectional Transformers for Language Understanding," arXiv: 1810.04805v2 (May 2019) (16 pages).

Kaiming He et al., "Delving Deep into Rectifiers: Surpassing Human-Level Performance on ImageNet Classification," arXiV:1502.01852v1 (Feb. 2015) (11 pages).

Pang Wei Koh et al., "Understanding Black-Box Predictions via Influence Functions," arXiV:1703.04730v3 (Dec. 2020) (12 pages).

Xiaobo Liang et al., "R-Drop: Regularized Dropout for Neural Networks," arXiv:2106.14448v2 (Oct. 2021) (21 pages).

Mnhan Liu et al., "Roberta: A Robustly Optimized BERT Pretraining Approach," arXiv:1907.11692v1 (Jul. 2019) (13 pages).

Yu Qin et al., "What You Say and How You Say It Matters: Predicting Financial Risk using Verbal and Vocal Cues," 57th Annual Meeting of the Association for Computational Linguistics (ACL 2019), pp. 390-401 (Jul./Aug. 2019).

Stephen Robertson et al., "The Probabilistic Relevance Framework: BM25 and Beyond," Foundations and Trends in Information Retrieval, vol. 3, No. 4, pp. 333-389 (2009) (59 total pages).

Mike Schuster et al., "Bidirectional Recurrent Neural Networks," IEEE transactions on Signal Processing, vol. 45, No. 11 (Nov. 1997), 2673-2681.

Ashish Vaswani et al., "Attention is All You Need," arXiv:1706.03762v5 (Dec. 2017) (15 pages).

Linyi Yang et al., "Html: Hierarchical Transformer-Based Multi-Task Learning for Volatility Prediction," (2020), Faculty of Engineering and Information Sciences—Papers: Part B. 4184 (13 pages).

Yi Yang et al., "Finbert: A Pretrained Language Model for Financial Communications," arXiv:2006.08097v2 (Jul. 2020) (5 pages).

Haoyi Zhou et al., "Informer: Beyond Efficient Transformer for Long Sequence Time-Series Forecasting," arXiv:2012.07436v3 (Mar. 2021) (15 pages).

Ramit Sawhney et al., "VolTAGE: Volatility Forecasting via Text-Audio Fusion with Graph Convolution Networks for Earnings Calls," In Proceedings of the 2020 Conference on Empirical Methods in Natural Language Processing (EMNLP), pp. 8001-8013 (Nov. 2020).

Yi Tay et al., "Sparse Sinkhorn Attention," arXiv:2002.11296v1 (Feb. 2020) (10 pages).

Shuohang Wang et al., "Cluster-Former: Clustering-based Sparse Transformer for Question Answering," arXiv:2009.06097v2 (Jun. 2021) (11 pages).

Linyi Yang et al., "Exploring the Efficacy of Automatically Generated Counterfactuals for Sentiment Analysis," arXiv:2106.15231v3 (Mar. 2022) (12 pages).

Silviu Pitis et al., "Counterfactual Data Augmentation Using Locally Factored Dynamics," arXiv:2007.02863v2 (Dec. 2020) (26 pages).

Torn Adams et al., "Earnings announcement saliency and option trading," Review of Financial Economics 2022;40, pp. 44-62.

Mell et al., "The NIST Definition of Cloud Computing," NIST Special Publication 800-145, Sep. 2011 (7 pages).

Zhang et al., "Disentanglement-based Cross-Domain Feature Augmentation for Effective Unsupervised Domain Adaptive Person Re-identification," arXiv:2103.13917v1 (Mar. 2021) (10 pages).

Chen et al., "Data Augmentation for Cross-Domain Named Entity Recognition," arXiv:2109.01758v1 (Sep. 2021) (11 pages).

Li et al., "A Cross-Domain Augmentation-Based AI Learning Framework for In-Network Gesture Recognition," IEEE Network (Sep./Oct. 2021) (8 pages).

Disclosed Anonymously, "Method and System for Out-of-the-Box IT Query-to-Resolution for AIOps," IPCOM000270016D (May 2022)•(3 pages).

Disclosed Anonymously, "System and Method for Domain Expert to Evaluate Machine Learning Models via Construction of Test Scenarios," IPCOM000269570D (Apr. 2022) (14 pages).

Disclosed Anonymously, "Method and Associated System for Making Predictions from Unstructured Data Explainable," IPCOM000262392D (May 2020) (14 pages).

Arnaud Van Looveren et al., "Interpretable Counterfactual Explanations Guided by Prototypes," arXiv:1907.02584v2 (Feb. 2020) (17 pages).

* cited by examiner

| Description | Earnings call | News sentence | QE sentence |
|---|---|---|---|
| # of involved companies | 1,022 | 4,266 | 576 |
| # of total cases | 17,520 | 2,706,340 | 15,731,211 |
| # of total OP augmented cases | 17,520 | 2,622,897 | 83,443 |
| # of total QA augmented cases | 17,520 | 7,789,062 | 7,942,149 |

| | Method | Original EC | | | News-augmented EC | | | QE-augmented EC | | |
|---|---|---|---|---|---|---|---|---|---|---|
| | | OP | QA | OP + QA | aOP | aQA | aOP + aQA | aOP | aQA | aOP + aQA |
| n=3 | RB | 0.3328 | 0.3162 | 0.3228 | 0.3436 | 0.3245 | 0.3228 | 0.3386 | 0.3129 | 0.3103 |
| | TFB | 0.3237 | 0.3237 | 0.3237 | 0.3237 | 0.3237 | 0.3237 | 0.3237 | 0.3237 | 0.3237 |
| | BOW | 0.3679 | 0.3868 | 0.3545 | 0.3893 | 0.4021 | 0.3888 | 0.3160 | 0.3203 | 0.3111 |
| | Longformer-base | 0.3336 | 0.3191 | 0.3428 | 0.3567 | 0.3329 | 0.3518 | 0.3428 | 0.3573 | 0.3369 |
| | Longformer-large | 0.3461 | 0.3245 | 0.3485 | 0.3535 | 0.3328 | 0.3577 | 0.3593 | 0.3228 | 0.3303 |
| | Informer | 0.3583 | 0.3352 | 0.3649 | 0.3674 | 0.3418 | 0.3902 | 0.3567 | 0.3368 | 0.3711 |
| | MDRM | 0.4655 | 0.4570 | 0.3758 | 0.4839 | 0.4782 | 0.3959 | 0.4625 | 0.4411 | 0.3575 |
| | HTML | 0.4204 | 0.3722 | 0.3734 | 0.4373 | 0.3734 | 0.3746 | 0.3673 | 0.3618 | 0.3716 |
| | E-MSCA-P | 0.4997 | 0.4846 | 0.5012 | 0.5253 | 0.5032 | 0.5239 | 0.5272 | 0.4936 | 0.5147 |
| | E-MSCA | 0.5137 | 0.5102 | 0.5233 | 0.5429 | 0.5328 | 0.5397 | 0.5368 | 0.5253 | 0.5271 |
| n=15 | RB | 0.3162 | 0.3179 | 0.3229 | 0.3469 | 0.3485 | 0.3477 | 0.3029 | 0.3378 | 0.3229 |
| | TFB | 0.3710 | 0.3710 | 0.3710 | 0.3710 | 0.3710 | 0.3710 | 0.3710 | 0.3710 | 0.3710 |
| | BOW | 0.3364 | 0.3493 | 0.3263 | 0.3601 | 0.3796 | 0.3884 | 0.2964 | 0.3014 | 0.2915 |
| | Longformer-base | 0.2916 | 0.2818 | 0.3057 | 0.3287 | 0.3001 | 0.3162 | 0.3052 | 0.2966 | 0.3028 |
| | Longformer-large | 0.3179 | 0.3037 | 0.3187 | 0.3427 | 0.3112 | 0.3378 | 0.3270 | 0.3154 | 0.3344 |
| | Informer | 0.3383 | 0.3294 | 0.3445 | 0.3370 | 0.3328 | 0.3781 | 0.3354 | 0.3175 | 0.3452 |
| | MDRM | 0.4329 | 0.4159 | 0.4103 | 0.4568 | 0.4461 | 0.4197 | 0.4560 | 0.4267 | 0.4072 |
| | HTML | 0.4047 | 0.3916 | 0.3828 | 0.4255 | 0.4126 | 0.4052 | 0.3986 | 0.4092 | 0.4118 |
| | E-MSCA-P | 0.4658 | 0.4404 | 0.4710 | 0.4964 | 0.4693 | 0.4746 | 0.4871 | 0.4692 | 0.4616 |
| | E-MSCA | 0.4719 | 0.4523 | 0.4830 | 0.5039 | 0.4821 | 0.5033 | 0.4912 | 0.4793 | 0.5009 |

900

| Dataset | QP+News | Groundtruth label: Up (2) | Time span: 15-day | Topic | Rank (TracIn*) | Predicted label |
|---|---|---|---|---|---|---|
| 1. Original | Clinical trial A is intended to serve as a confirmatory study for clinical trial B and support global regulatory applications for approval, and product A in combination with product B is another key effort. | | | Health | | 1 |
| Positive | Breakthrough therapy designation for product A in combination with product B based on initial results from phase 1 of clinical trial A. | | | | 1 (4.91e-1) | 2 |
| Negative | *I can more easily make a case for upside from there than I can for significant downside.* | | | | | 1 |
| 2. Irrelevant | Thanks, and good afternoon, everyone. | | | None | | 1 |
| Positive | Stock Market starting to look very good to me! | | | | | 2 |
| Negative | " *As global commodity prices have declined sharply in recent days, we are prepared to reduce our spending if the current environment does not improve* " *as said on a call with analysts.* | | | | | 2 |

| Dataset | QA+News | Groundtruth label: Down (0) | Time span: 3-day | Topic | Rank (TracIn*) | Predicted label |
|---|---|---|---|---|---|---|
| 3. Original | And do you know what roughly the impact that would have in terms of EBITDA for 2019? | | | Financial Results | | 1 |
| Positive | Now, that was the strongest growth in terms of that metric, all of 2019, all of 2018. | | | | 2 (1.16e-2) | 0 |
| Negative | *This level of adjusted EBITDA reflects the challenging macroeconomic environment that developed during the year and worsened during the fourth quarter.* | | | | | 1 |
| 4. Irrelevant | Let's turn to our 2019 cash flow forecast, which is on Slide 11. | | | None | | 1 |
| Positive | People look at them as cash flow stories agnostic of economic growth. | | | | | 0 |
| Negative | *Plus, Brand X reportedly nears a sale of part of company.* | | | | | 0 |

| Expert-Defined Topic | News Topic Definition |
|---|---|
| Fiscal policy | Events covering monetary and fiscal policy and policy makers. |
| Central bank operation | Trading by a central bank in the open market in order to influence exchange rates or stabilize market conditions. |
| New product launch | A company's launch of a new product or service. |
| Corporate financing issues | Issues regarding an organization's financial accounting and the auditing of the organization's financial statements and accounting records. |
| Management turnover | Changes of senior personnel in a corporation / organization. |
| Service disruption | A disruption and/or resumption of production or services at an energy-related or commodity processing facility. |
| KPI evaluation | KPIs evaluate the success of an organization or of a particular activity in which it engages. Often success is simply the repeated, periodic achievement of some levels of operational goals, and sometimes success is defined in terms of making progress toward strategic goals. |

1500
---
Input: Pre-trained language model $LM(\cdot)$ with parameter set $w_{LM}$; Learning step $\eta$; EC dataset $\mathcal{E}$; External dataset $\mathcal{S}$ used for sentence-level perturbation; A set of expert-tailored topics $T$.
Output: The fine-tuned topic classifier
1: Use Solr to implement full-text search over $\{\mathcal{E}, \mathcal{S}\}$ with the topic queries $T$;
2: Generate a collection of matching triplets <external_sentence, topic, relevance_score> based on Eq. (8);
3: For each topic, extract the top-$N_t$ ranked triplets as positive instances, and bottom-$N_t$ ranked triplets as negative instances;
4: Combine all instances to generate the training set $\mathcal{I}$;
5: Fine-tune $LM(\cdot)$ in the binary classification task, i.e., to decide whether a given pair of sentence and topic is matched;
6: for $i = 1, \ldots, |\mathcal{I}|$ do
7:     $w_{LM} \leftarrow w_{LM} - \eta \nabla \mathcal{L}(\mathcal{I}, w_{LM})$;
8: end for

FIG. 15

1600
---
Input: An EC instance $E$; Target sentence $e \in E$ to be perturbed; External dataset $\mathcal{S} = \{s_1, \ldots, s_N\}$ for sentence-level perturbation; The quantities of positively and negatively augmented instances $k_p$, $k_n$, respectively.
Output: Positively and negatively augmented data.
1: ▷ ## Calculate $TracIn^+$ scores between original and perturbed EC texts
2: for $i = 1, \ldots, N$ do
3:     Perturb sentence $e$ with $s_i$ to generate new perturbed $E'$;
4:     Compute $score_i = TracIn^+(E, E')$ based on Eq. (6);
5: end for
6: ▷ ## Positive augmentation
7: Retrieve $\{s_i\}_{i \in \{1, \ldots, k_p\}}$ with the top-$k_p$ ranked scores;
8: Generate a set of positively augmented ECs $\{E_i\}$ by perturbing sentence $e$ with $s_i$, where $i \in \{1, \ldots, k_p\}$;
9: Feed $\{E_i\}_{i \in \{1, \ldots, k_p\}}$ to E-MSCA's EC encoder and obtain the corresponding labels;
10: ▷ ## Negative augmentation
11: Retrieve $\{s_j\}_{j \in \{1, \ldots, k_n\}}$ with the bottom-$k_n$ ranked scores;
12: Generate a set of negatively augmented ECs $\{E_j\}$ by perturbing sentence $e$ with $s_j$, where $j \in \{1, \ldots, k_n\}$;
13: Assign their corresponding labels with (1/3, 1/3, 1/3).

FIG. 16

|   | Method | Original EC | | | News-augmented EC | | | QE-augmented EC | | |
|---|---|---|---|---|---|---|---|---|---|---|
|   |   | OP | QA | OP + QA | aOP | aQA | aOP + aQA | aOP | aQA | aOP + aQA |
| n=3 | RB | 0.3033 | 0.2983 | 0.2970 | 0.3157 | 0.2989 | 0.3043 | 0.3135 | 0.2946 | 0.2842 |
|   | TFB | 0.3112 | 0.3112 | 0.3112 | 0.3112 | 0.3112 | 0.3112 | 0.3112 | 0.3112 | 0.3112 |
|   | BOW | 0.3359 | 0.3524 | 0.3383 | 0.3516 | 0.3623 | 0.3498 | 0.2863 | 0.3014 | 0.2934 |
|   | Longformer-base | 0.2834 | 0.2754 | 0.2947 | 0.2931 | 0.3084 | 0.2992 | 0.2785 | 0.2898 | 0.2749 |
|   | Longformer-large | 0.3194 | 0.2989 | 0.3233 | 0.3287 | 0.3121 | 0.3280 | 0.3364 | 0.2951 | 0.3107 |
|   | Informer | 0.3052 | 0.3041 | 0.2936 | 0.3207 | 0.3174 | 0.3232 | 0.2968 | 0.2863 | 0.2955 |
|   | MDRM | 0.3403 | 0.3404 | 0.3051 | 0.3559 | 0.3601 | 0.3324 | 0.3547 | 0.3513 | 0.3049 |
|   | HTML | 0.3417 | 0.3352 | 0.3402 | 0.3546 | 0.3628 | 0.3732 | 0.3037 | 0.3129 | 0.3122 |
|   | E-MSCA-P | 0.3560 | 0.3465 | 0.3681 | 0.3690 | 0.3512 | 0.3613 | 0.3702 | 0.3669 | 0.3728 |
|   | E-MSCA | 0.3653 | 0.3644 | 0.3706 | 0.3768 | 0.3637 | 0.3810 | 0.3729 | 0.3779 | 0.3764 |
| n=15 | RB | 0.2938 | 0.2896 | 0.3043 | 0.3179 | 0.3233 | 0.3216 | 0.2833 | 0.2971 | 0.2964 |
|   | TFB | 0.3513 | 0.3513 | 0.3513 | 0.3513 | 0.3513 | 0.3513 | 0.3513 | 0.3513 | 0.3513 |
|   | BOW | 0.3061 | 0.3118 | 0.3029 | 0.3225 | 0.3238 | 0.3312 | 0.2733 | 0.2943 | 0.2640 |
|   | Longformer-base | 0.2772 | 0.2636 | 0.2852 | 0.2973 | 0.2842 | 0.2996 | 0.2891 | 0.2748 | 0.2835 |
|   | Longformer-large | 0.2908 | 0.2816 | 0.2979 | 0.3135 | 0.2923 | 0.3028 | 0.3035 | 0.2899 | 0.3082 |
|   | Informer | 0.2318 | 0.2311 | 0.2498 | 0.2313 | 0.2378 | 0.2782 | 0.2358 | 0.2111 | 0.2492 |
|   | MDRM | 0.3357 | 0.3403 | 0.3448 | 0.3418 | 0.3526 | 0.3573 | 0.3484 | 0.3466 | 0.3457 |
|   | HTML | 0.3321 | 0.3128 | 0.3351 | 0.3492 | 0.3358 | 0.3776 | 0.3229 | 0.3350 | 0.3426 |
|   | E-MSCA-P | 0.3462 | 0.3325 | 0.3452 | 0.3589 | 0.3461 | 0.3538 | 0.3606 | 0.3563 | 0.3512 |
|   | E-MSCA | 0.3546 | 0.3482 | 0.3619 | 0.3714 | 0.3578 | 0.3756 | 0.3639 | 0.3624 | 0.3703 |

FIG. 17

UNSUPERVISED CROSS-DOMAIN DATA AUGMENTATION FOR LONG-DOCUMENT BASED PREDICTION AND EXPLANATION

STATEMENT REGARDING PRIOR DISCLOSURES BY THE INVENTOR OR A JOINT INVENTOR

The following disclosure(s) are submitted under 35 U.S.C. 102(b)(1)(A): DISCLOSURE(S):

"Multi-Domain Transformer-Based Counterfactual Augmentation for Earnings Call Analysis," Zixuan Yuan, Yada Zhu, Wei Zhang, Ziming Huang, Guangnan Ye, Hui Xiong, arXiv:2112.00963v1 Dec. 2, 2021 (9 pages).

"Multi-Domain Transformer-Based Counterfactual Augmentation for Earnings Call Analysis," Zixuan Yuan, Yada Zhu, Wei Zhang, Ziming Huang, Guangnan Ye, Hui Xiong, arXiv:2112.00963v2 Dec. 3, 2021 (9 pages).

"Earnings Call Analysis Using a Sparse Attention Based Encoder and Multi-Source Counterfactual Augmentation," Zixuan Yuan, Yada Zhu, Wei Zhang, Ziming Huang, Guangnan Ye, Hui Xiong, Paper ID 415, submitted to KDD '22 on Dec. 1, 2021 (11 pages).

"Earnings Call Analysis Using a Sparse Attention Based Encoder and Multi-Source Counterfactual Augmentation," Zixuan Yuan, Yada Zhu, Wei Zhang, Ziming Huang, Guangnan Ye, Hui Xiong, Paper ID 1629, submitted to TheWebConf2023 on Oct. 1, 2022 (11 pages).

FIELD OF THE INVENTION

The present invention relates to deep machine learning, and more particularly, to unsupervised cross-domain data augmentation techniques for long-text document based prediction and explanation.

BACKGROUND OF THE INVENTION

During an earnings call, the management of a publicly-traded company discloses the past performance and future outlook for the company. Earnings calls are a key resource for investors and equity analysts. For instance, investors often plan their trades near the date of an upcoming earnings call conference, and equity analysts use the information provided during such events to update their earnings estimates. Traditionally, market practitioners manually analyze earnings call transcripts along with industrial knowledge to make earnings forecasts and estimate the impact the earnings call will have on financial markets.

Recently, the analysis of earnings call transcripts has come under the spotlight of both artificial intelligence and finance communities due to its value in understanding company fundamentals. For instance, several specialized deep learning methods have been proposed for automatic earnings call analysis. However, these approaches have been hampered by the inherent challenges associated with earnings call data analysis. Namely, while each earnings call transcript is typically lengthy, earnings calls are held infrequently (e.g., quarterly or even only yearly). As such, there is an overall scarcity of data for training purposes. Further, earnings call transcripts tend to include a lot of noisy sentences over a variety of different topics, making it a challenge to capture salient content.

Therefore, techniques for efficient and effective prediction and explanation of lengthy, scarce and noisy documents such as earnings call transcripts would be desirable.

SUMMARY OF THE INVENTION

The present invention provides unsupervised cross-domain data augmentation techniques for long-text document based prediction and explanation. In one aspect of the invention, a system for long-document based prediction is provided. The system includes: an encoder for creating embeddings of long-document texts with hierarchical sparse self-attention, and making predictions using the embeddings of the long-document texts; and a multi-source counterfactual augmentation module for generating perturbed long-document texts using unlabeled sentences from at least one external source to train the encoder.

In another aspect of the invention, a method for long-document based prediction is provided. The method includes: creating, by an encoder, embeddings of long-document texts with hierarchical sparse self-attention; training the encoder using perturbed long-document texts generated by counterfactual augmentation with unlabeled sentences from at least one external source; and making predictions, by the encoder, using the embeddings of the long-document texts.

A more complete understanding of the present invention, as well as further features and advantages of the present invention, will be obtained by reference to the following detailed description and drawings.

BRIEF DESCRIPTION OF THE DRAWINGS

FIG. 13 is a diagram illustrating unlabeled news sentences that were chosen to positively perturb the original earnings call transcript for volatility prediction according to an embodiment of the present invention;

FIG. 14 is a diagram illustrating non-limiting topic examples according to an embodiment of the present invention;

FIG. 15 is a diagram illustrating an exemplary methodology for training the topic classifier according to an embodiment of the present invention;

FIG. 16 is a diagram illustrating an exemplary methodology for unsupervised counterfactual augmentation according to an embodiment of the present invention; and FIG. 17 is a diagram illustrating Macro-F1 performance of the present MSCA approach as compared to baseline methods according to an embodiment of the present invention.

DETAILED DESCRIPTION OF PREFERRED EMBODIMENTS

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by hose of skill in the art, data is typically moved at some occasional points in time during normal operations of a storage device, such as during access, de-fragmentation or garbage collection, but this does not render the storage device as transitory because the data is not transitory while it is stored.

Figure 1:
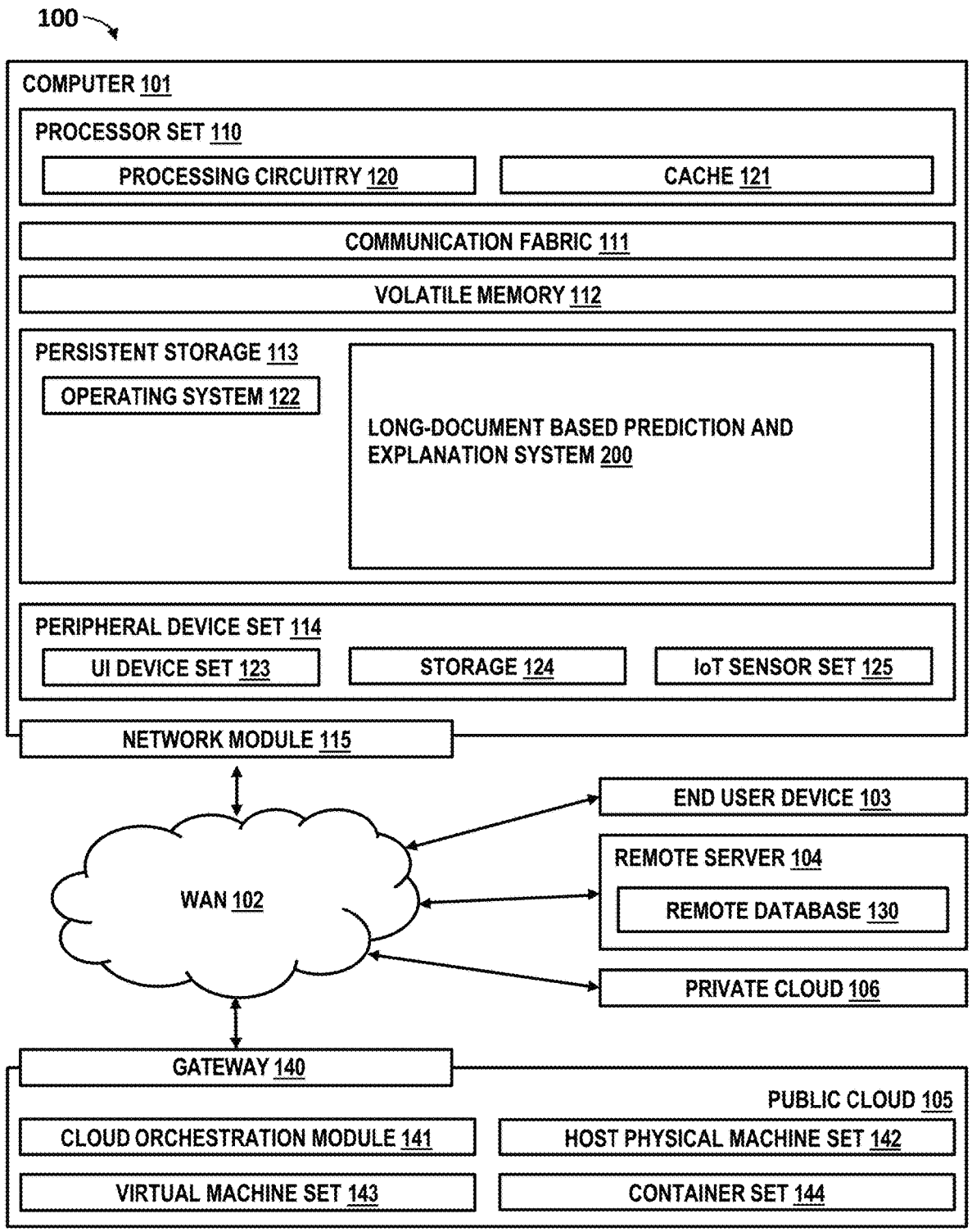
FIG. 1 is a diagram illustrating an exemplary computing environment according to an embodiment of the present invention

Referring to FIG. 1, computing environment 100 contains an example of an environment for the execution of at least some of the computer code involved in performing the inventive methods, such as long-document based prediction system 200. In addition to system 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and system 200, as identified above), peripheral device set 114 (including user interface (UI), device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip."

In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in system 200 in persistent storage 113.

COMMUNICATION FABRIC 111 is the signal conduction paths that allow the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, the volatile memory is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in system 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

As provided above, the inherent scarcity and noisy properties of long-(text) documents such as earnings call transcripts makes automated analysis of these documents a considerable challenge. For instance, earnings call transcripts typically contain more than 500 sentences, which makes it harder to learn the semantic structure. Further, these documents are produced infrequently (e.g., earnings calls occur once per quarter or even only once per year). This scarcity of training data poses a problem for conventional general-purpose, data-intensive deep learning models. Also, earnings call transcripts tend to include significant amounts of noisy sentences with greetings like "Hello" and "How are you" and may cover a wide variety of different topics, e.g., supply chain, operational efficiency, etc. Thus, it is a significant challenge for a machine learning model to pinpoint the most salient sentences in the document such as the content in an earnings call transcript that is key to understanding the relevant corporate fundamentals.

Advantageously, provided herein is a unique text encoder with a sparse self-attention mechanism to address the lengthiness and noisiness issues by paying better attention to salient information buried in long noisy documents. Also, a multi-source data augmentation framework is provided to leverage abundant unlabeled texts from (multiple) external sources such as financial news to address the data scarcity issue. The term 'external source' refers to sources of (unlabeled) text outside of the subject long-document itself. Thus, if the long-document is an earnings call transcript, then text taken from somewhere other than the earnings call transcript such as from financial news is considered to be from an external source. As will be described in detail below, the unlabeled text serves as external perturbations to the original transcripts under strong semantic and task-specific constraints, which aids in efficient model learning. Namely, the concept of counterfactual learning (CL) is used to identify decision-influencing texts by answering the question of "how would the outcome change if the selected texts were modified"? Advantageously, the present techniques leverage such counterfactual learning to incorporate these abundant yet unlabeled external texts to enhance the salient long-text document content.

There are some notable challenges involved in applying these concepts to the long-text document analysis of earnings call transcripts. First, there is the complexity of semantic saliency. Namely, the salient information that tightly correlates with the market performance of a company can either be highly domain-specific (e.g., supply-chain topics are more critical to the manufacturing and e-commerce industries than the energy-utility industry) or domain-general (e.g., revenue, change of CEO, merging and acquisitions, etc.). It has also been observed that, for over 80% of earnings call transcripts analyzed, more than 40% of the statements contained therein were irrelevant to understanding the corporate fundamentals. Thus, a goal of the present techniques is to identify content that possess both topic relatedness to industrial or financial topics, and task relevance to a financial forecasting task such as market volatility. In that regard, as will be described in detail below, the present techniques employ a transformer-based earnings call transcript encoder that applies hierarchical sparse self-attention to distill texts with those features.

Second, as provided above, the amount of earnings call transcript data is limited since earnings calls are held once per quarter or year. Thus, it is important to leverage unlabeled text to benefit large-scale neural language models. Arguably, self-supervised learning regimes such as masked word prediction do not necessarily provide a theoretical guarantee to fully unlock the potential of unlabeled data for a prediction task. To this end, the present techniques provide a unique multi-source counterfactual augmentation (or MSCA) framework, which utilizes abundant unlabeled text to improve the generalization ability and prediction explainability of the model. As will be described in detail below, the unlabeled text from external sources such as financial news are used to replace some 'salient' sentences in the earnings call transcripts as sentence perturbations. Ideally, a sentence perturbation should have both semantic alignment with the original/replaced (perturbed) earnings call sentence, and task alignment with the original/replaced (perturbed) earnings call sentence on task relevance. By 'semantic alignment' it is meant that the original earnings call sentences and the sentence perturbations have a same intended meaning. As its name implies, 'task relevance' refers to the relevance of a feature in performing a given task such as financial forecasting. In that regard, the original earnings call sentences and the sentence perturbations should both be task-relevant.

For instance, regarding semantic alignment, according to an exemplary embodiment topic alignment is enforced between a perturbing and perturbed sentence by a distantly-supervised topic classifier that assigns each sentence a topic label. Since the distribution of topic-based sentences is highly skewed, in one embodiment, the same number of sentences is selected for each topic to avoid the imbalanced classification problem.

For task alignment, unlabeled sentences are selected which cause the perturbed earnings call transcripts (i.e., the earnings call transcript having sentences replaced with text from the external source) to optimize the text encoder in a similar direction as the original (i.e., unperturbed) earnings call transcript. For instance, if the original earnings call transcript predicts a downward direction of the volatility movement of the prediction task, then the text encoder based on the perturbed earnings call transcripts should similarly predict a downward direction. Since the gradients are assessed before being applied as a model update, this is a counterfactual learning approach. In one embodiment, an example-based model explanation (EME) method (TracIn+) is used to measure the degree to which an unlabeled sentence would impact a model decision if it were used to replace some sentence in an earnings call transcript. Based on the measurements, the unlabeled sentences are ranked. That ranking is then used to select the unlabeled sentences to use as perturbations for the earnings call transcripts. The encoder learning alternates between the supervised training and unsupervised counterfactual augmentation.

Figure 2:
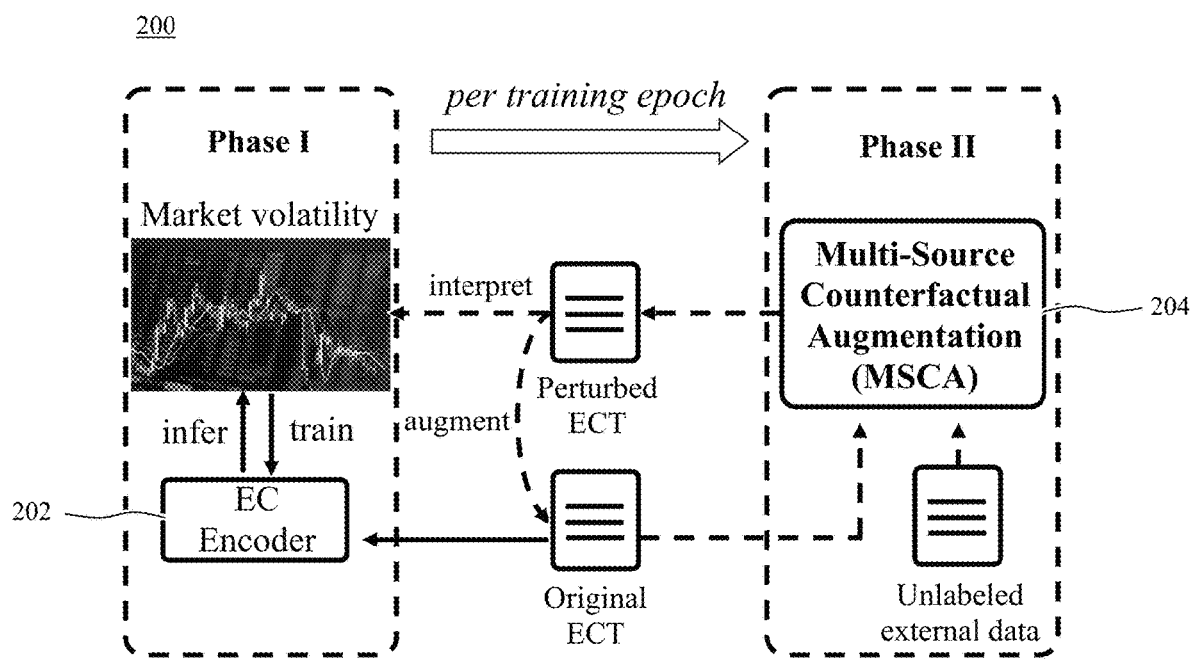
FIG. 2 is a diagram illustrating an exemplary system for long-document based prediction and explanation having an encoder, a multi-source counterfactual augmentation module, and a semi-supervised augmentation routine according to an embodiment of the present invention.

Given the above overview, an exemplary system 200 for long-document based prediction and explanation in accordance with the present techniques is now described by way of reference to FIG. 2. According to an exemplary embodiment, the long-documents are earnings call transcripts, and system 200 is employed to predict the future market volatility of a set of individual stocks using the earnings call transcripts of the respective companies. For instance, suppose that there are M earnings call transcripts $\varepsilon=\{E_1, \ldots, E_M\}$, each of which is a sequence of sentences padded to the maximum length of L. Padding accounts for sentences of different lengths, and can include adding zeros for short sentences and/or truncating sentences that exceed the maximum number of words. Also available is a set of N sentences from another source for earnings call augmentation, i.e., $S=\{s_1, \ldots, s_N\}$. Lowercase and capital letters (e.g., e and E) will be used throughout to denote vectors and matrices, and all $W_s$ and $b_s$ are the trainable weight matrices and bias terms, respectively. For a given stock, the market volatility is calculated by averaging the standard deviations of log returns over n days ($n\in\{3,15\}$) following the date of the earnings call. The volatility values are then categorized into three different levels: downward, steady, and upward fluctuations, labeled as $\{0,1,2\}$, respectively, and a mapping function $\mathcal{F}(E)\to\{0,1,2\}$ is learned. It is notable, however, that predicting future market volatility form earnings call transcripts is merely one of the applications contemplated herein. Namely, the present techniques are more generally applicable to any other domains and tasks involving long-document analysis especially those with sparse, noisy data.

As shown in FIG. 2, system 200 includes three major components, a (text) encoder 202 (which in the context of earnings call analysis is also referred to herein as an 'earnings call or EC encoder') to encode long-document texts such as earnings call transcripts for market volatility inference, a multi-source counterfactual augmentation (MSCA) module 204 that includes a topic classifier and an unlabeled text scoring algorithm based, e.g., on the example-based model explanation method TracIn+, and a semi-supervised augmentation routine for training the encoder 202. As will be described in detail below, the encoder 202 is trained with perturbed earnings call transcripts (i.e., 'Perturbed ECT') derived using unlabeled texts from external sources (i.e., 'Unlabeled external data') such as financial news by the multi-source counterfactual augmentation module 204 that both semantically and task-wise align (see above) with the original earnings call transcripts (i.e., 'Original ECT'). In FIG. 2, the solid and dashed lines represent the supervised and unsupervised learning data flows, respectively. As shown in FIG. 2 and as will be described in detail below, training of the encoder 202 is performed in multiple rounds until convergence. In each round, the encoder 202 is first trained using labeled data in a labeled earnings call transcript pool as training data (Phase I). The multi-source counterfactual augmentation module 204 is then used to create new perturbed earnings call transcripts (Phase I) that are added to the labeled earnings call transcript pool for subsequent rounds. The process is iterated through multiple rounds until convergence.

According to an exemplary embodiment, the encoder 202 is a transformer-based encoder. In machine learning, a transformer is a neural network machine learning model that follows an encoder-decoder framework. The encoder in a transformer architecture is used to map an input sequence to a sequence of continuous representations. The transformer attention mechanism draws connections between different parts of the sequence.

Figure 3:
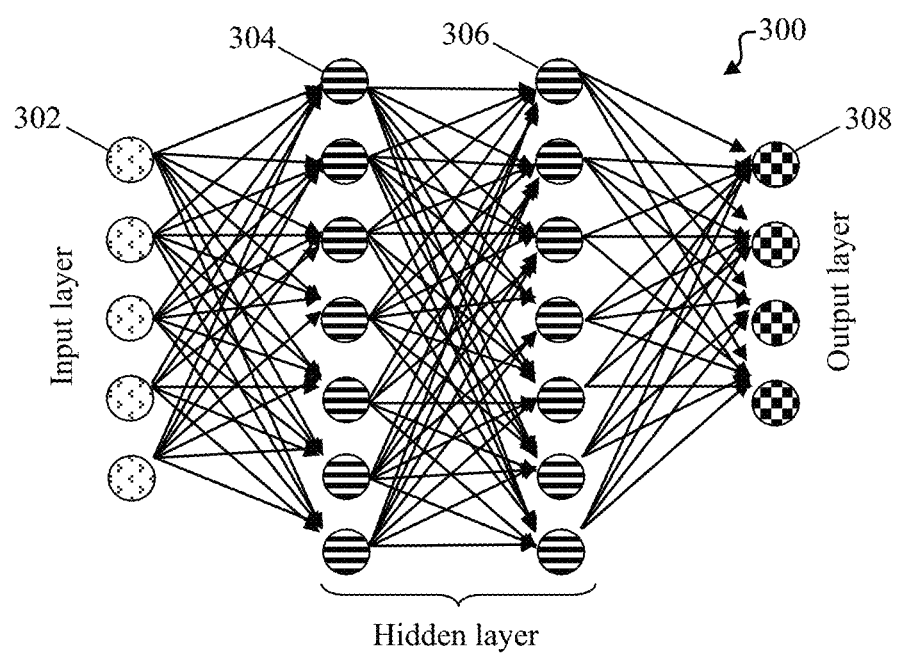
FIG. 3 is a diagram illustrating an exemplary neural network according to an embodiment of the present invention.

Referring to FIG. 3, an exemplary neural network 300 is shown that includes a plurality of interconnected processor elements 302, 304/306 and 308 that form an input layer, at least one hidden layer, and an output layer, respectively, of the neural network 300. In machine learning and cognitive science, neural networks are a family of statistical learning models inspired by the biological neural networks of animals, and in particular the brain. Neural networks may be used to estimate or approximate systems and cognitive functions that depend on a large number of inputs and weights of the connections which are generally unknown. Neural networks are often embodied as so-called "neuromorphic" systems of interconnected processor elements which act as simulated "neurons" that exchange "messages" between each other in the form of electronic signals. The connections in neural networks that carry electronic messages between simulated neurons are provided with numeric weights that correspond to the strength or weakness of a given connection. These numeric weights can be adjusted and tuned based on experience, making neural networks adaptive to inputs and capable of learning. Typically, neural networks are trained on labeled sets of training data. Once trained, the neural network can be used for inference. Inference applies knowledge from a trained neural network model and uses it to infer a result. A fully connected layer (typically the last or last few layers in a neural network) is a layer where all of the inputs from one layer are connected to every activation unit of the next layer. The fully connected layer(s) compile the data extracted by previous layers of the neural network to form the final output.

Figure 4:
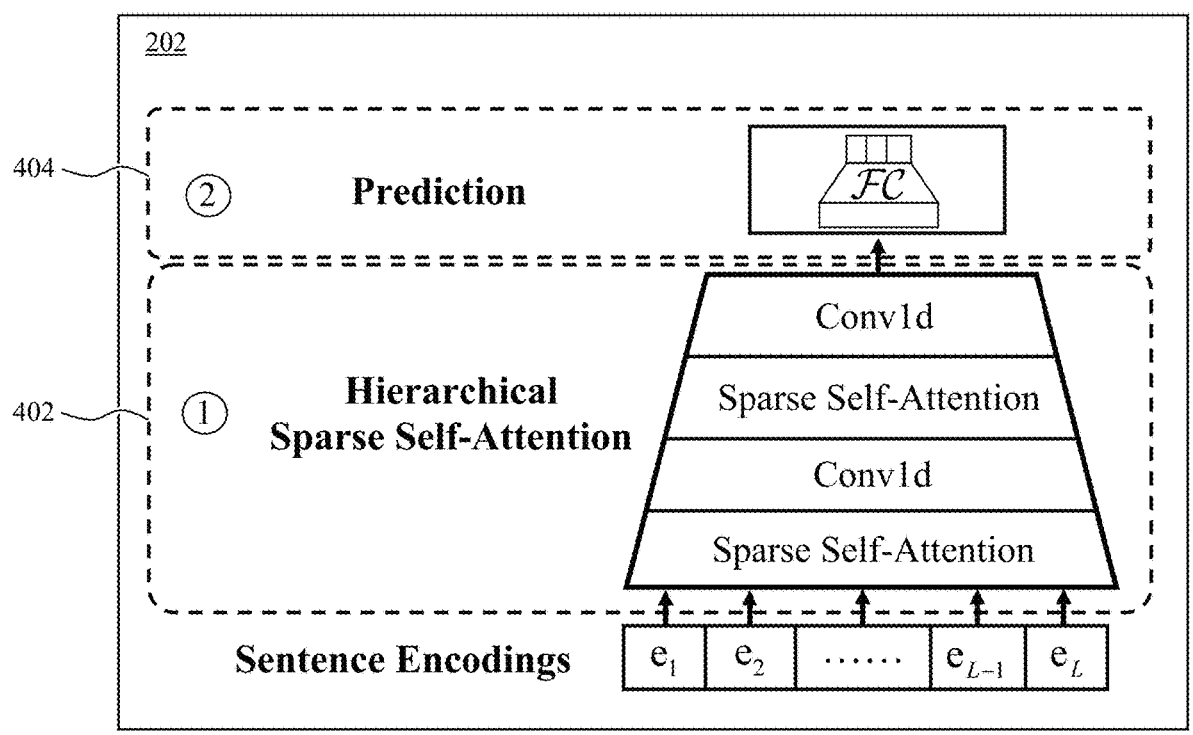
FIG. 4 is a diagram illustrating an exemplary configuration of the encoder according to an embodiment of the present invention.

An exemplary configuration of the (transformer-based) encoder 202 is provided in FIG. 4. As shown in FIG. 4, in this embodiment, encoder 202 includes a hierarchical sparse self-attention framework 402 and a predictor 404. As provided above, an encoder in a transformer architecture is used to map an input sequence (for example, the sequence of sentences in each of the M earnings call transcripts $\varepsilon = \{E_1, \ldots, E_M\}$) to a sequence of continuous representations. The transformer self-attention mechanism draws connections (also referred to herein as 'dependencies') between different sentences in the sequence including long-range dependencies amongst, e.g., distant sentences in the long-document texts. Thus, the process of predicting an output value will take into account these long-range dependencies. By 'sparse' it is meant that the self-attention mechanism makes a limited selection of connections from the resulting sequence, rather than all possible dependencies.

In that regard, hierarchical sparse self-attention framework 402 of encoder 202 is used to capture the long-range sentence-level dependencies for earnings call transcript encoding. To initialize an earnings call representation $E \in \mathbb{R}^{L \times d}$, each sentence e in the earnings call transcripts is encoded into an embedding vector $e = LM(e) + p \in \mathbb{R}^{1 \times d}$ (see 'Sentence Encodings' in FIG. 4), where $LM(\cdot)$ denotes a sentence-level encoding function of a pre-trained language model such as a robustly optimized BERT approach (RoBERTa) model, with [CLS] embedding of size d used as output. The position embedding p is calculated as:

$$\begin{cases} P_{pos,2m} = \sin(pos/10000^{2f/d}), \\ P_{pos,2m+1} = \cos(pos/10000^{2f/d}), \end{cases} \quad (1)$$

where pos is the sentence position and $f$ is the dimension of sentence embedding.

The initial earnings call representation E is then fed to the hierarchical sparse self-attention framework 402 which, according to the exemplary embodiment shown in FIG. 4, includes two stacked layers of multi-head sparse self-attention (i.e., 'Sparse Self-Attention') and 1-D convolutional filter (i.e., 'Conv1d') with the Parameterized Exponential Linear Units activation function $PeLU(\cdot)$:

$$\begin{cases} \tilde{E} = SP^2(SP^1(EW_{inp} + b_{inp})), \\ SP^i(\cdot) = MaxPool(PeLU(Conv1d([\cdot]_{HS}))), \\ [\cdot]_{HS} = Concat(head_1^i, \ldots, head_h^i) W_h^i, \\ head_j^i = Softmax\left(\frac{\hat{Q}_j^i K_j^{iT}}{\sqrt{d}}\right) V_j^i \end{cases} \quad (2)$$

in which $\tilde{E}$ is the ultimate representation of the earnings call transcripts, and $W_{inp} \in \mathbb{R}^{d \times d}$. For the i-th stacked layer $SP^i(\cdot)$, $i \in \{1, 2\}$, $$\hat{Q} \in \mathbb{R}^{\frac{d}{i} \times \frac{d}{i}}, K \in \mathbb{R}^{\frac{d}{i} \times \frac{d}{i}}, V \in \mathbb{R}^{\frac{d}{i} \times \frac{d}{i}}.$$

Two functions are implemented in Equation 2 to refine salient semantic features from long-text earnings call transcripts. First, a maxpooling layer $MaxPool(\cdot)$ with stride 2 is added to down-sample E into its half slice after stacking one layer. Second, a sparse matrix $\hat{Q}$ is implemented, which considers only the top-$n_E$ queries under the sparsity estimation:

$$S(q_x^i, K_j^i) = \max_y \left\{ \frac{q_x k_y^T}{\sqrt{d/i}} \right\} - \frac{1}{d/i} \sum_{y=1}^{d/i} \left\{ \frac{q_x k_y^T}{\sqrt{d/i}} \right\},$$

where $q_x^i$, $k_y^i$ stand for the i-th row in the j-th head queries $Q_j^i$ and keys $K_j^i$, respectively. By filtering out trivial weights, such maxpooling operation and sparsity matrix enable the encoder 202 to focus on those attentively important sentences.

Based on the learned representation $\tilde{E}$ of the earnings call transcripts, predictor 404 which contains a fully-connected layer (i.e., $\mathcal{FC}$) is used to predict, i.e., forecast, an output value taking into consideration the long-range dependencies (see above) in the learned representation $\tilde{E}$. See FIG. 4. In general, the fully-connected layer of a neural network is used to learn the relationship between the independent variables that serve as input to the neural network, and the dependent variables that are output from the neural network. For instance, according to an exemplary embodiment, the fully-connected layer of predictor 404 uses the learned representation $\tilde{E}$ of the earnings call transcripts to predict the significance level y (i.e., downward, steady, and upward fluctuations) of market volatility over n-days following the date of the earnings call:

$$y = Softmax(W_p \tilde{E} + b_p). \quad (3)$$

It is notable that embodiments are also considered herein where other sequential methods such as long short-term memory are also be applied as the prediction function.

Figure 5:
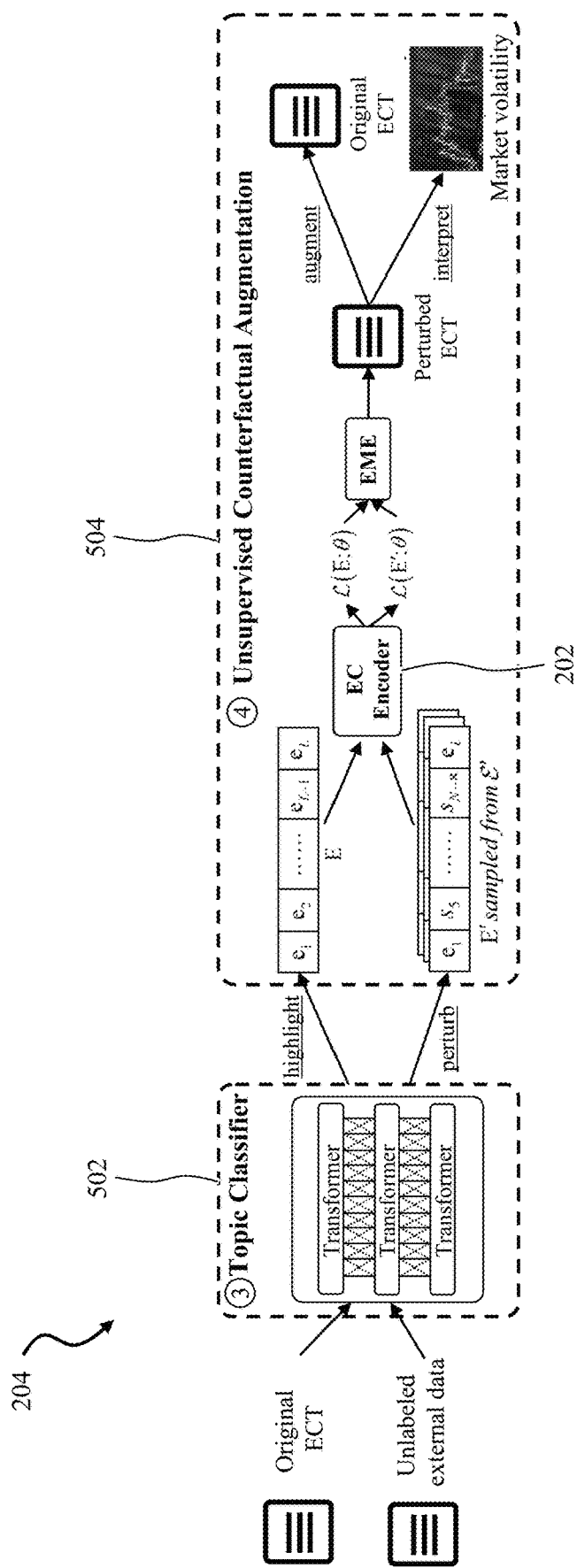
FIG. 5 is a diagram illustrating an exemplary configuration of the multi-source counterfactual augmentation module according to an embodiment of the present invention.

As highlighted above, in order to address the data scarcity issue, the multi-source counterfactual augmentation module 204 is used to train the encoder 202 with new perturbed earnings call transcripts that both semantically and task-wise align with the original earnings call transcript. A discussion of how these properties of semantic alignment and task alignment are enforced is now provided by way of reference to FIG. 5 which illustrates an exemplary configuration of the multi-source counterfactual augmentation module 204. According to an exemplary embodiment, semantic alignment is achieved using a topic classifier 502. Namely, salient information usually concentrates on topical sentences. Thus, improving the diversity of salient texts can lead to faster and more generalized model learning than enriching that of irrelevant texts. Thus, as shown in FIG. 5, the topic classifier 502 is created to (1) identify salient earnings call sentences from the original earnings call transcript (i.e., 'Original ECT') for perturbation, and (2) link a (salient) earnings call sentence and its corresponding unlabeled sentences from external sources (i.e., 'Unlabeled external data') such as financial news through topics, to provide semantic alignment of the perturbations. Here, 'salience' refers to task-oriented importance. In the example shown illustrated in FIG. 5, a transformer-based model is employed as the topic classifier 502.

For training efficiency, in one exemplary embodiment, a distant supervision route is taken for learning the topic classifier 502. With this distant supervision route, data preparation involves first chunking unlabeled texts into sentences and indexing them. Next, for each topic t in a total of $N_f$ topics, its definition is used as a query to search the index and choose the top Nt sentences as positive examples for label t. By way of example only, in one non-limiting implementation, each topic is defined with a single sentence by domain experts. Meanwhile, $N_t$ sentences are sampled from other topics as negative examples. The topic classifier 502 is trained with this pseudo data. Further details of the training procedure are provided below.

As shown in FIG. 5, task alignment enforcement is carried out by unsupervised counterfactual augmentation module 504 which uses an example-based model explanation (EME) method such as TracIn+ to measure the degree to which an unlabeled sentence obtained from an external source (Unlabeled external data' such as financial news) would change a model prediction if it were used to replace one of the salient sentences (see above) identified in the original (i.e., unperturbed) earnings call transcript ('Original ECT'). In particular, an instance-based influence function is leveraged to encode the task alignment into the cross-entropy loss difference:

$$pc(E'|E;\theta) = \mathcal{L}(E';\theta) - \mathcal{L}(E;\theta), \quad (4)$$

in which θ is the encoder 202 model trained with labeled earnings call data, E and E' denote the embeddings by encoder 202 of original and perturbed earnings call transcripts, respectively. As highlighted above, the term 'perturbed earnings call transcripts' refers to a perturbed version of the original earnings call transcript ('Original ECT') where some of its sentences have been replaced by unlabeled sentences obtained from the external source(s) ('Unlabeled external data'). Equation 4 is equivalent to pc(E'|E,θ)=logit$_y$(E;θ)−logit$_y$(E;θ), in which every term in the right-hand side is the logit output evaluated at a model prediction γ from model θ right before applying the softmax function. The model impact of E' is next quantified by adding a fraction of pc(E'|E,θ) scaled by a small value ϵ to the overall loss and obtain θ:=argmin$_\theta \mathbb{E}_{E_i \in \varepsilon^{train}}[\mathcal{L}(E_i,\theta)]+\epsilon \mathcal{L}(E';\theta)-\epsilon \mathcal{L}(E;\theta)$, where ram $\varepsilon^{train} \in \varepsilon$ denotes the EC set used for training. The corresponding influence of up-weighing the importance of E' on θ is:

$$\frac{d\theta_{\epsilon E'|E}}{d\epsilon}\bigg|_{\epsilon=0} = H_\theta^{-1}(\nabla_\theta \mathcal{L}(E';\theta)), \quad (5)$$

where $$H_\theta = \frac{1}{\lceil e\varepsilon^{train}\rceil}\Sigma_{E_i \in \varepsilon^{train}} \nabla_\theta \mathcal{L}(E_i,\theta)$$

is the positive definite Hessian matrix by assumption. By applying the above equation and the chain rule, a new influence of E' on E is obtained as:

$$\nabla_\epsilon \mathcal{L}(E;\theta_{\epsilon E'|E}) = \nabla_\theta \mathcal{L}(E;\theta) H_\theta^{-1}(\nabla_\theta \mathcal{L}(E;\theta) - \nabla_\theta \mathcal{L}(E';\theta)).$$

If it is assumed that the influence of a training instance E is the sum of its contribution to the overall loss all through the entire training history, then the above influence function can be relaxed into a form similar to the Hessian-free TracIn+ (·,·) as:

$$TracIn^+(E,E') = -\sum_i \nabla_{\theta_i}\mathcal{L}(E;\theta_i)\nabla_{\theta_i}pc(E'|E;\theta_i) \quad (6)$$

in which i iterates through the checkpoints saved at different training steps. The above equation intuitively measures the similarity of the model optimization direction between the entire earnings call transcript and the semantic change caused by the perturbation.

It is notable that Equation 6 enforces an extremely strong alignment condition where the original earnings call transcript gradient has to align with the gradient of the perturbed sentence (Equation 4) which can be more distinct than that of the entire perturbed earnings call $\nabla_\theta \mathcal{L}(E';\theta)$. In general, a gradient is a derivative of a function that has more than one input variable. Intuitively, the majority of the perturbed earnings call transcripts are the same as the original earnings call transcripts (to maintain content integrity). Using $\nabla_\theta \mathcal{L}(E';\theta)$ in Equation 6 may not highlight the impact of the perturbed sentence and may cause the TracIn+ to blur. Putting together the two alignment constraints, i.e., topic and task alignment, it is found that the perturbing sentence tends to significantly resemble the perturbed earnings call transcript on both semantics and market sentiments, which is validated below.

Figure 6:
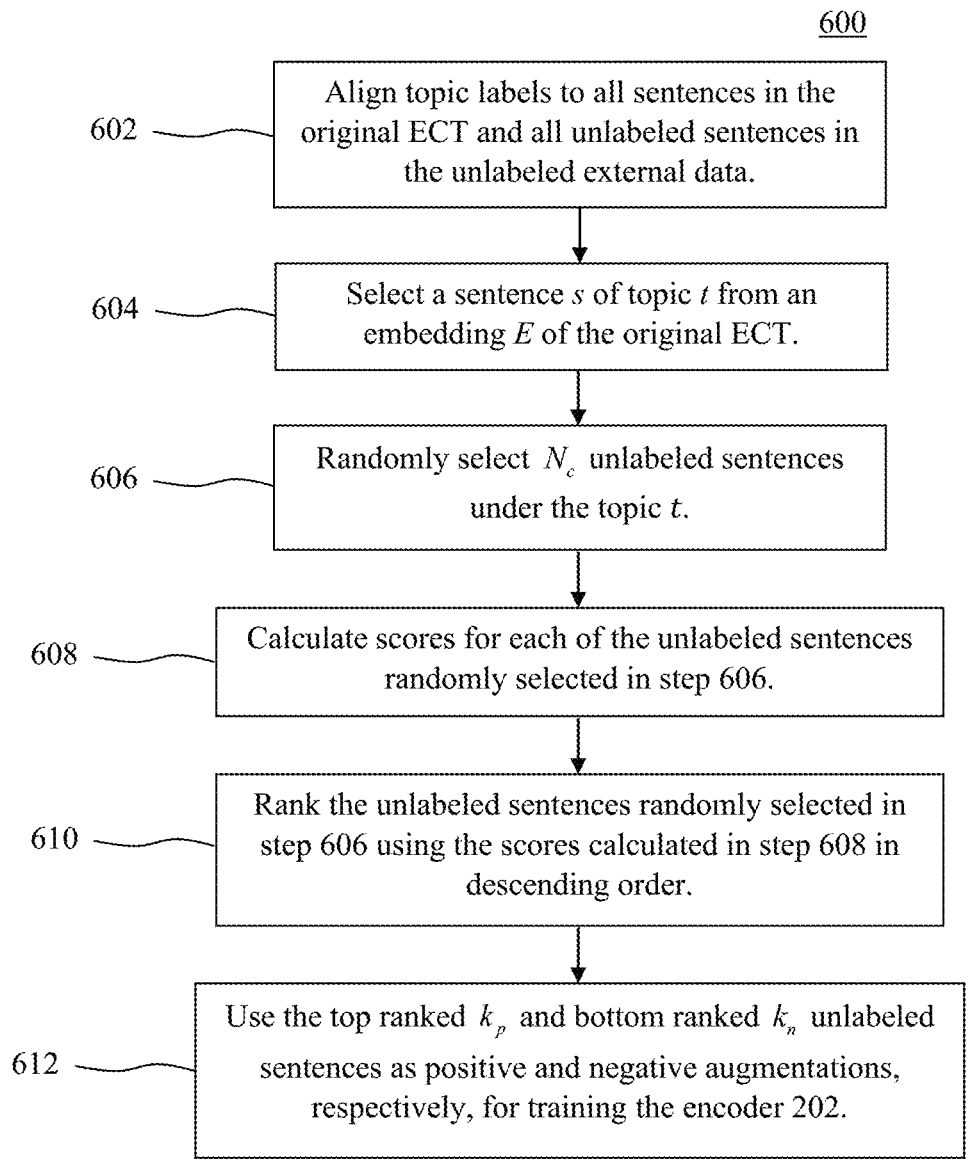
FIG. 6 is a diagram illustrating an exemplary methodology for using the multi-source counterfactual augmentation module to create perturbed earnings call transcripts for training the encoder according to an embodiment of the present invention.

An exemplary methodology 600 for using multi-source counterfactual augmentation module 204 to create perturbed earnings call transcripts to augment training of encoder 202 is now described by way of reference to FIG. 6. In step 602, topic classifier 502 aligns topic labels to all sentences in the original earnings call transcript and to all unlabeled sentences in the unlabeled external data. By 'aligns' it is meant that the sentences belong to the same topic. In step 604, an embedding E of the original (i.e., unperturbed) earnings call transcript is sampled and, from all topical sentences, one sentence s of topic t is selected according to some topic distribution. As opposed to 'salience' (which, as provided above, refers to the task-oriented importance), 'topical' stands for the semantic-level topics. Thus, in the context of the present techniques, salient sentences are first identified, and then those salient sentences are replaced with semantically close or distant ones for effective perturbations.

In step 606, a total of $N_c$ unlabeled sentences under the topic t are randomly selected. In step 608, the TracIn+ scores are calculated for each of the unlabeled sentences randomly selected in step 606. In step 610, the unlabeled sentences randomly selected in step 606 are then ranked by TracIn+ score in descending order. In step 612, the top ranked $k_p$ and bottom ranked $k_n$ unlabeled sentences are then used as positive and negative augmentations, respectively, for training the encoder 202 by directly assigning the predicted labels to the top ranked sentences, and the evenly-distributed target vector (i.e., (⅓, ⅓, ⅓)) to the bottom ranked sentences. The details of the above perturbations are provided below. According to an exemplary embodiment, the predicted labels refer to volatility movement, i.e., downward, steady and upward.

Meanwhile, the bottom-$k_n$ unlabeled sentences will also help model explainability if the label of the perturbed earnings call transcript is altered or flipped (from right to wrong). Compared to using the top-$k_p$ unlabeled sentences, the bottom-$k_n$ unlabeled sentences may provide richer insight thanks to the label-flipping power. By 'label-flipping' it is meant that the predicted label changes following perturbation when the sentence is replaced by a sentence from the unlabeled text.

For training, the following multi-class, cross-entropy loss for updating the encoder 202 is defined as:

$$\mathcal{L} = -\sum_c p(c) \cdot log \ q(c \mid \mathcal{F}(\tilde{E})), \quad (7)$$

where $p(\cdot)$, $q(\cdot)$ are the label and the predicted score for each market volatility level $c \in \{0,1,2\}$, respectively. A semi-supervised training protocol is used that alternates between the supervised learning of the encoder 202 and the augmentation using multi-source data. For each round of alternation, the labeled earnings call transcript pool is first used as training data to train the encoder 202, and then the above-described augmentation process is applied to create new perturbed earnings call transcripts that are added to the labeled earnings call transcript pool for the subsequent rounds. This process is iterated multiple times until convergence. To further reduce model overfitting, in one exemplary embodiment a bidirectional Kullback-Leibler (KL) regularization component is introduced in the above loss, which enables the output distributions of different sub-models generated by dropout to be consistent with each other:

$$\mathcal{L}_{KL} = \mathcal{L} + \frac{\alpha}{2}[\mathcal{KL}(\mathcal{F}(\tilde{E})_1 \mid\mid \mathcal{F}(\tilde{E})_2)) + \mathcal{KL}(\mathcal{F}(\tilde{E})_2 \mid\mid \mathcal{F}(\tilde{E})_1)],$$

in which $\alpha$ is the hyperparameter, and $\mathcal{KL}(\cdot)$ is the KL divergence between these two logits distributions upon dropout. One notable finding is that two regularization techniques (i.e., KL divergence and data augmentation) used in the present encoder 202/multi-source counterfactual augmentation (MSCA) module 204 system (also referred to herein as "E-MSCA") are empirically complementary to produce superimposed performances, which further highlights the significance of data augmentation during the model training.

Figures 7, 8:
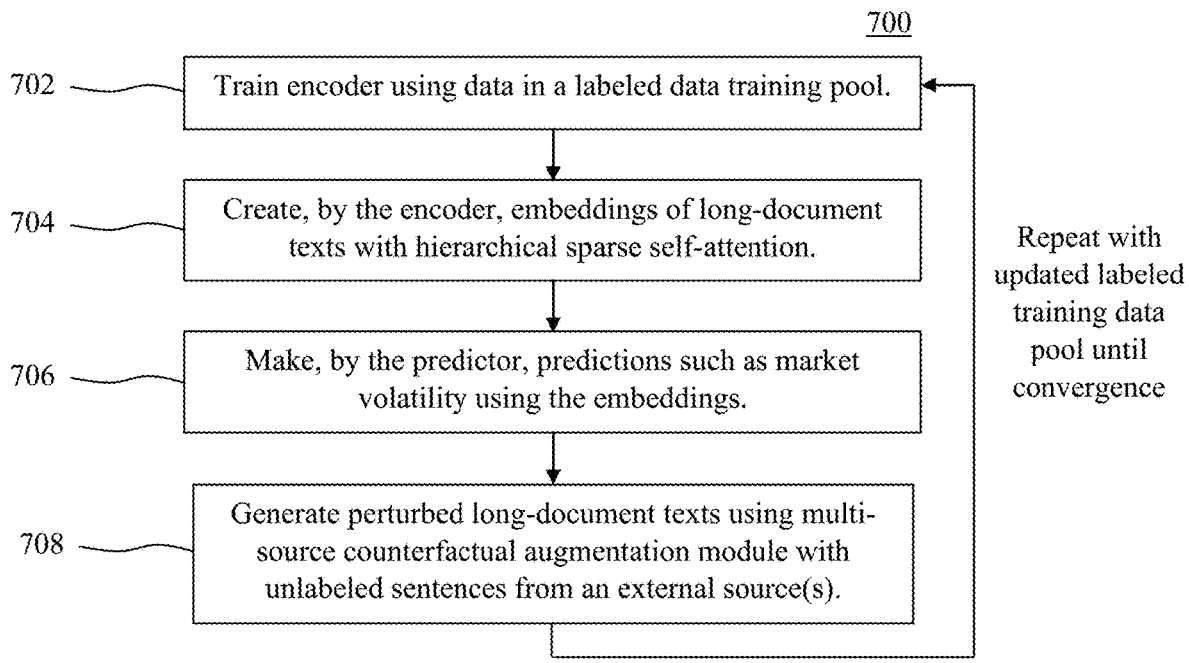
FIG. 7 is a diagram illustrating an exemplary methodology for long-document based prediction using the system of FIG. 2 according to an embodiment of the present invention.
FIG. 8 is a diagram illustrating statistics of the datasets used for evaluation of the present multi-source counterfactual augmentation (MSCA) approach according to an embodiment of the present invention.

Given the above, an exemplary methodology 700 for long-document based prediction in accordance with the present techniques is now described by way of reference to FIG. 7. According to an exemplary embodiment, methodology 700 is performed by long-document based prediction system 200 and its various constituent components, i.e., encoder 202, multi-source counterfactual augmentation module 204, etc. described in conjunction with the descriptions of FIGS. 2-5 above.

In step 702, the encoder 202 is trained with training data in a labeled training data pool. In step 704, embeddings of long-document texts are created using the hierarchical sparse self-attention framework 402 of the encoder 202. According to an exemplary embodiment, the long-document texts are earnings call transcripts. However, the present techniques are more generally applicable to any long-documents (e.g., documents having more than 500 sentences). Notably, as described in detail above, earnings call transcripts are particularly challenging for automated learning since they are long, noisy, and sparse (i.e., earnings call transcripts are released quarterly or even only yearly). As provided above, the encoder 202 employs a hierarchical sparse self-attention framework 402 to address the lengthiness and noisiness issues by paying better attention to salient information buried in long noisy documents such as earnings call transcripts.

In step 706, predictions are made with the embeddings from step 704 using predictor 404 of the encoder 202. For instance, by way of example only, with earnings call transcripts predictions of a significance level of market volatility over n-days following an earnings call can be made in step 706.

In step 708, perturbed long-document texts are generated by multi-source counterfactual augmentation module 204 with unlabeled sentences from an external source(s) such as financial news. The details of an exemplary process for creating the perturbed long-document texts for earnings call transcripts using multi-source counterfactual augmentation module 204 was described in conjunction with the description of methodology 600 of FIG. 6 above. Notably, however, the topic classifier 502 of multi-source counterfactual augmentation module 204 provides topic labels for the unlabeled sentences from the external source(s). Unsupervised counterfactual augmentation module 504 uses an example-based model explanation method such as TracIn+ to score, and then rank sentences for the purposes of selecting training data for the encoder 202.

As provided above, these newly generated perturbed long-document texts are then added to the labeled training data pool for use in subsequent rounds. Namely, as shown in FIG. 7, steps 702-708 are repeated using the newly generated perturbed long-document texts in the (updated) labeled training data pool from the previous round(s) in each subsequent round for training the encoder 202 until convergence.

The present techniques are further described by way of reference to the following non-limiting examples. For instance, the present techniques were evaluated using M=17520 quarterly earnings call transcripts that covered 1,022 publicly traded U.S. companies and their earnings calls from May 1, 2018, to Jun. 30, 2020. Each earnings call transcript included an opening remarks (OP) session and a question-answering (QA) session, where the QA session usually contained more redundant messages than the OP session. Three evaluation datasets were created based on the above transcripts, namely, OP, QA, and OP+QA. For each evaluation dataset, two sets of unlabeled external texts were used for augmentation: 1) publicly available textual transcripts of earnings conference calls (short for quarterly earnings (QE)) with labels removed, and 2) publicly available corporate financial news released for the majority of U.S. public traded companies for Oct. 1, 2019, to Jan. 1, 2020. The statistics of the datasets are summarized in table 800 of FIG. 8, where 'Earnings call' is the original earnings call transcript dataset, 'News sentence' is the dataset augmented with the financial news data, and 'QE sentence' is the dataset augmented with the QE conference call data. There were 221 ($N_f$=221) expert-refined market topics considered in the experiments. Examples of topic descriptions and providers are given below.

The data was chronologically ordered and split into train, validation, and test based on the 8:1:1 ratio (a ratio often employed to split data for train, validation and text). The $33^{rd}$ and $66^{th}$ percentiles of all log volatilities were selected as thresholds for the three-class assignment. Accuracy and macro-averaged F1 scores were measured for both short-term (n=3) and long-term (n=15) volatility prediction. The Macro-averaged F1 results are provided below.

An open-sourced language model RoBERTaForSequenceClassification, which is part of the encoder architecture, was used as the pre-trained language model LM (·) to initialize all input embeddings for the base model. The parameters of the topic classifier 502 were fine-tuned based on its last two layers and output head using a batch size of 64, max epochs of 100, and a learning rate of $1 \times 10^{-5}$. Details of network parameters and expert-defined topics are provided below.

The present approach, denoted as E-MSCA, combines the above-described earnings call (EC) encoder 202 and multi-source counterfactual augmentation (MSCA) module 204 in a semi-supervised manner. The performance of E-MSCA was compared with a variety of benchmark methods, including three fuzzy methods, three transformer-based methods, two earnings call-specific methods, and one variant of E-MSCA. Specifically, the benchmark methods included a Random baseline (RB) approach that uniformly generates random labels from three possible outcomes, a Ticker following baseline (TFB) approach that predicts the current earnings call-triggered volatility outcome using the volatility of the previous quarter, a Bag-of-words baseline (BOW) that encodes the earnings call transcripts by bag of word embeddings which are mean-pooled before being fed into a multi-layer perceptron neural network, a Longformer-base model that combines both local and global attentions based on a transformer network for modeling long-sequence data, a Longformer-large model which is a variant of the Longformer-base model with more network layers, Informer which uses ProbSparse self-attention for long-sequence data to handle feature redundancy and quadratic time and memory, MDRM a multi-model deep regression model for volatility prediction based on earnings call transcripts (where only the textual part is used, and single layer bidirectional long short-term memory (BiLSTM) is leveraged as the model architecture), HTML a hierarchical transformer-based multi-task learning (HTML) model for encoding earnings call transcripts using sentence embedding as its input, and E-MSCA-P which is a variant of the present E-MSCA but without the KL regularization term.

For fair comparison, for all models, two iterations of iterative training were conducted, where the max epoch for each stage was 40. Also, RoBERTa-large was used to initialize the input embeddings of earnings call sentences for all the above baseline methods except for RB and TFB.

Figures 9, 10A:
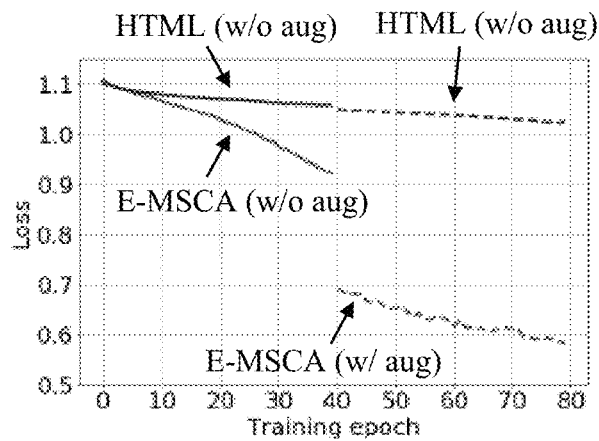
FIG. 9 is a diagram illustrating accuracy performance of the present MSCA approach as compared to baseline methods according to an embodiment of the present invention.
FIG. 10A is a diagram illustrating training loss between encoder training and counterfactual augmentation according to an embodiment of the present invention.

Table 900 in FIG. 9 presents the overall performance comparisons of the present E-MSCA approach and all baseline methods using (1) original earnings call transcripts ('Original EC'), and (2) two augmented datasets (i.e., 'News-augmented EC' which is the dataset augmented with the financial news data, and 'QE-augmented EC' which is the dataset augmented with the QE conference call data), each of which contained three cases of augmented opening remarks (OP), i.e., 'aOP,' augmented question-answering (QA), i.e., 'aQA,' and augmented EC, i.e., 'aOP+aQA.' As shown in table 900, E-MSCA, as well as its variant E-MSCA-P, significantly outperformed all other baseline methods on nine sub-datasets for (3-day, 15-day) volatility prediction, which illustrates some notable advantages. First, the present encoder 202 pays attention to salient information hidden in noise. The performance comparison between the 'OP' and 'OP+QA' cases is noteworthy because QA sessions contains significantly more redundant conversational texts than OP sessions. Different from MDRM and HTML, the prediction accuracies of the present E-MSCA are barely affected when 'QA is added to 'OP' across all three evaluation datasets. This finding highlights the advantage of the present encoder 202 framework against these customized deep learning models on handling noisy inputs. It was also observed that the general transformer models do not generally learn well, indicating the difficulty of the long text encoding task. In addition, the carefully-designed long-text encoders such as Longformer and Informer may have demonstrated their focus being computational efficiency rather than efficacy.

Second, counterfactual augmentation can further boost accuracy. Namely, as shown in different column groups of table 900, both news-augmented and QE-augmented earnings call (EC) datasets can significantly improve model learning on top of using only the original EC. Further, as compared to the QE-augmented dataset, the news-augmented dataset can provide more gains for model update due to its large size of unlabeled sentence pool. Interestingly, the KL regularization not only serves a regularization purpose, but also imposes an orthogonal and additive effect on counterfactual augmentation, which is shown by comparing two differences: the difference between the row of E-MSCA and E-MSCA-P on the OP column, and the difference of E-MSCA row on the OP column between the original EC and the news-augmented EC. This observation reveals that such counterfactual augmentation provides a unique solution to the data scarcity issue, as compared to traditional model learning schemes.

Third, an earnings call transcript is a complex long-sequence document that requires special encoder design. Both earnings call transcript-specified baselines MDRM and HTML demonstrate obvious superiority over the three generalized language models. Moreover, the simple baseline methods such as bag-of-words, although stronger than generalized language models, still lag significantly behind E-MSCA, which suggests that the task is more contextual than lexical. Notably, from the comparison of Longformer base and large models, there was not a significant difference in performance. This indicates that scaling up model size may not be an efficient way to address the text encoding challenge. In general, sentence-as-input encoders, e.g., MDRM, HTML, and E-MSCA, significantly outperform token-as-input encoders Longformer and Informer, which proves the necessity of customized design.

To analyze each component of the present E-MSCA, controlled experiments of the 3-day volatility prediction were conducted to study the difference between competing methods. Regarding analysis of the encoder 202, the present E-MSCA was compared to the architecturally closest baseline HTML on training loss for convergence testing, and training/validation accuracy for performance testing. Namely, in FIGS. 10A-B, two earnings call-based methods, E-MSCA and HTML, are shown during one round of iteration between encoder training (i.e., the first 40 epochs) and counterfactual augmentation (i.e., the last 40 epochs) for training loss (FIG. 10A) and prediction accuracy (FIG. 10B) on both training and validation sets. In FIGS. 10C-D, two semantic alignment methods, topic classifier and solr, during the augmentation phase for training loss (FIG. 10C) and prediction accuracy (FIG. 10D) on the validation set are shown. Specifically, for each of the E-MSCA encoder 202 and HTML, one round of alternative training between its predictive module and multi-source counterfactual augmentation (MSCA) module 204 was implemented, where for both stages, the predictive module trains with 40 epochs. The number 40 was chosen to guarantee sufficient learning.

Regarding convergence, it can be seen in FIG. 10A that E-MSCA fits data much faster than HTML in both stages, i.e., stage one being encoder training and stage two being counterfactual augmentation. This is attributable to the hierarchical sparse self-attention of encoder 202 being able to learn to capture salient content easier than HTML thanks to its noise-tolerant design. A sudden drop of training loss was also observed right when E-MSCA was switched to the augmentation stage. This suggests that the original training tends to overfit, and the semantics of the unlabeled text can immediately bring the model back on track to learn inductive bias properly to facilitate model generalization.

Figure 10B:
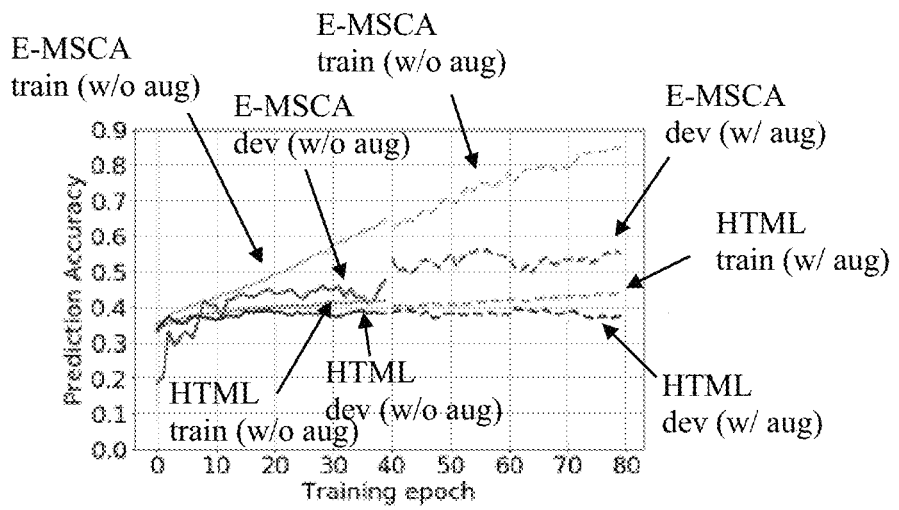
FIG. 10B is a diagram illustrating prediction accuracy between the encoder training and counterfactual augmentation according to an embodiment of the present invention.
Figure 10C:
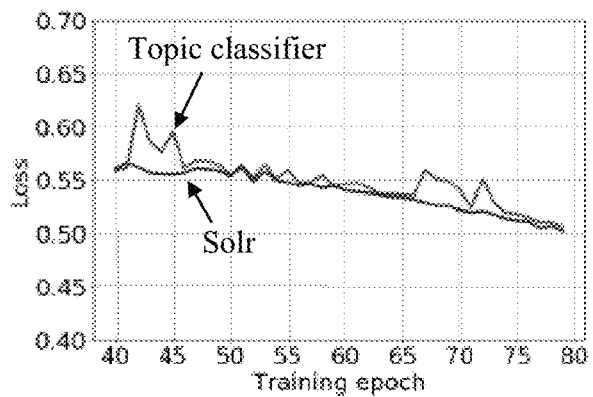
FIG. 10C is a diagram illustrating training loss during augmentation according to an embodiment of the present invention.
Figure 10D:
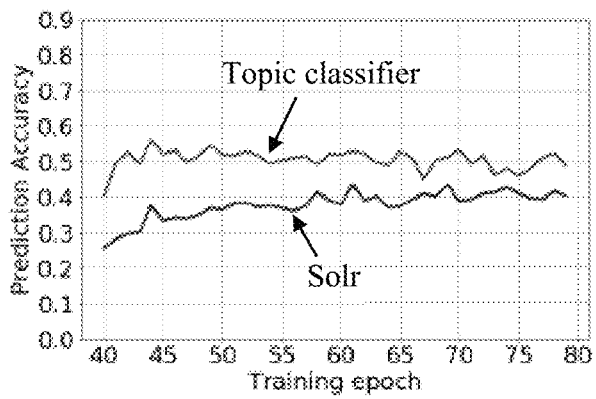
FIG. 10D is a diagram illustrating prediction accuracy during the augmentation according to an embodiment of the present invention.

Regarding accuracy, the detailed performance comparisons of these two EC-based methods are shown in FIG. 10B. Compared to HTML, E-MSCA achieved the best accuracy on two stages for both training and validation, which confirms the observation in convergence analysis.

Two aspects of topic influence on MSCA were analyzed, semantic alignment and perturbation efficiency. On semantic alignment, in earnings call transcript (ECT) E, a sentence e can only be perturbed by an unlabeled sentence s of the same topic, i.e., T(e)=T(s), where T( ) is the topic classifier. To validate if the alignment is necessary, two settings for selecting perturbing sentences were compared: 1) where the topic alignment constraint is removed and the unlabeled sentence with top-1 TracIn+ score is selected as a perturbation, and 2) where the top-1 topic-aligned sentence is picked, from the same candidate pool, as a perturbation. It is notable that this sentence may rank lower in the candidate pool. To improve the chance of finding useful unlabeled sentences, all unlabeled sentences were first indexed with solr, and a chosen earnings call sentence was used as a query to search the index and find the top 10000 sentences as perturbation candidates (in practice, 100 sentences per query were obtained on average). Candidates were then ranked by TracIn+ score, and the top-1 sentence or top-1 topic-aligned sentence was chosen as a perturbation. For fair comparison, the same model trained on the 'OP+QA' dataset was used to initiate the augmentation period of each alignment method. As shown in FIGS. 10C and 10D, the unconstrained perturbations can lead to quicker and stable training loss decrease, yet the topic-aligned perturbations make training loss unstable, where the fluctuations indicate the model is training on impactful knowledge. Referring to FIG. 10D, it can also be seen that such knowledge is indeed useful for model generalization, which is demonstrated by the validation set performance being significantly and constantly higher when the topic-aligned perturbations were used.

On perturbation efficiency, in ECT E it is assumed that some topics (and the corresponding sentences) are more important than others to perturb. To test this assumption, two settings which differ by choice of e were compared, i.e., topic-agnostic perturbation and topic-related perturbation. With topic-agnostic perturbation, it was assumed that every sentence is equally important to perturb. Thus, in that case, e was uniformly sampled from E, and perturbed with $\hat{s}$=arg max$_{s \in S}$ TracIn$^+$(E,E$_{e \to s}$)$\mathbb{I}$ (T(e)=T(s)), where E$_{e \to s}$ is the perturbed earnings call transcript (ECT). The max score attained by $\hat{s}$ is denoted as U(e|E,t,S). The top K sentences were randomly chosen and perturbed all at once, obtaining E$_{\{e\} \to \{s\}}$.

Figure 11A:
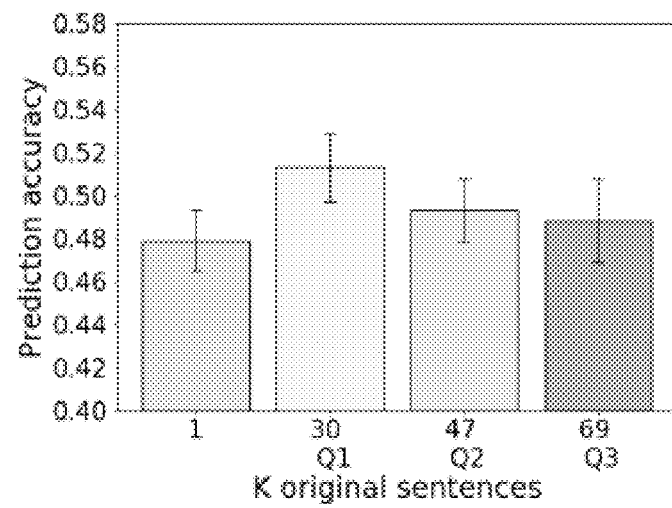
FIG. 11A is a diagram illustrating performance of a topic-agnostic perturbation method as compared to FIG. 11B which is a diagram illustrating performance of a topic-related perturbation method according to an embodiment of the present invention.
Figure 11B:
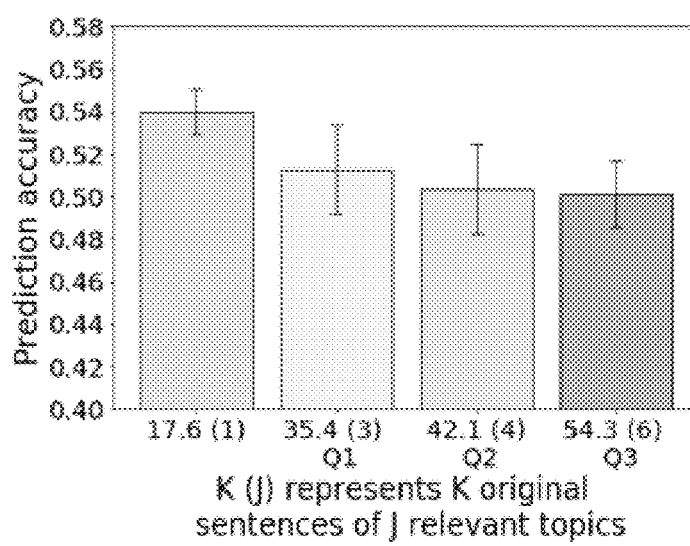

By comparison, with topic-related perturbation, it was assumed that some topics are more important than others to perturb. The importance of a topic t is defined as P(t|E,S) to measure the max contribution S can make on topic t in E. Formally, P(t|E,S)~$\Sigma_{e \in E}$U(e|E,t,S)$\mathbb{I}$ (T(e)=t) which aggregates the max contribution from every e of topic t. Then, a topic t$_i$ can be sampled from P(t|E,S), and all of its sentences e collected, each of which is replaced with its corresponding $\hat{s}$ to obtain E$_{\{e\}}$'. In this example, the top K sentences were chosen from solr and k<<|S|. The rank of s is r$_s$, and log$_2$(r$_i$+1) was used as weights for each TracIn+ score. The results for topic-agnostic and topic-related perturbation are shown in FIGS. 11A and 11B, respectively, where Q1, Q2 and Q3 denote the first, second and third quartiles the number of original sentences (FIG. 11A) and in the number of relevant topics (FIG. 11B). The present model was run with different numbers of perturbed sentences under the same MSCA framework with the 'aOP+aQA' dataset. For the topic-agnostic case, performance is the lowest when only 1 sentence was perturbed due to its low chance of being a salient topic, and peaks at around 30 sentences, which may be a balance of signal/noise texts. In the topic-related case, perturbing for one topic optimized the performance, likely because salient information in an earnings call transcript usually belongs to a single topic. The topic-related perturbation method presented an overall performance edge, and suggests identifying the influence of salient topics may lead to better model learning.

Figure 12:
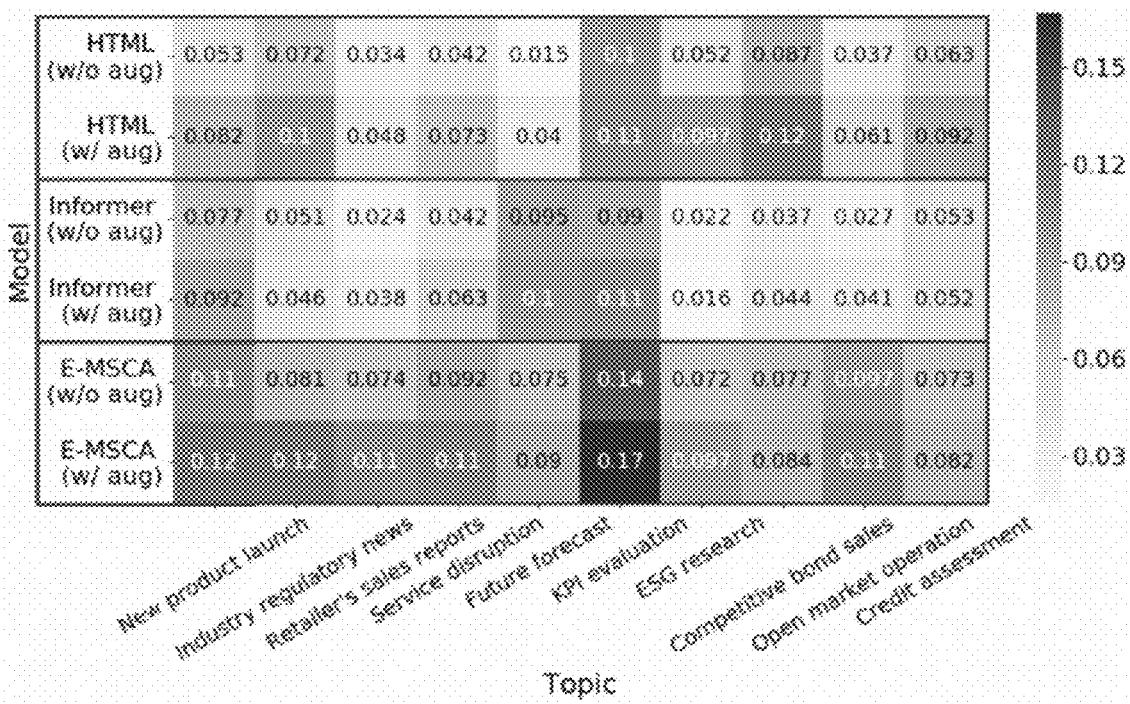
FIG. 12 is a diagram illustrating the ability to capture topic-related earnings call content with self-attention values according to an embodiment of the present invention.

Given the self-attention mechanism of the present encoder 202, the ability to capture salient earnings call transcript content among E-MSCA and two baselines (i.e., HTML, Informer) was analyzed in the context of a 15-day volatility prediction task. See FIG. 12. Namely, FIG. 12 depicts the average attention scores of salient sentences by each of the 10 most popular topics. It was observed that multi-source counterfactual learning encourages all models to pay more attention to important topics. Yet, E-MSCA excelled at capturing salient content in the pre-augmentation setting, which suggests sparse self-attention may assign sharper weights to informative texts (the darkest cube). Interestingly, attention from most encoders peaked at 'New product launch' and the 'KPI evaluation,' which intuitively aligns with the key aspects of what value-based investment decisions are based on.

For qualitative analysis, table 1300 in FIG. 13 provides some unlabeled news sentences that were chosen to positively perturb the original earnings call transcript for volatility prediction. Texts with similar semantic meaning are marked in table 1300 using the same underscore pattern. Specifically, two original earnings call transcript sentences were chosen for a single training data, one of which was randomly selected from a market-concerned topic, and the other which was a topic-irrelevant sentence. Each earnings call transcript sentence chosen was paired with two news sentences of the same topic.

Regarding positive augmentation, these perturbed instances were semantically close to the original ones, which validates the effectiveness of the topic classifier in maintaining semantic alignment. Moreover, the predicted labels being consistent with the original ones implied that TracIn+-powered rankings ensure the task-significance of perturbed data, and create a new way to improve training data quantity and diversity. Interestingly, as compared to OP-based augmentation, QA-based augmentation tends to be semantically distant from original earnings call texts based on the token-level text similarity. This is probably because much of the QA content involves long informal narratives and can hardly match those refined news statements based on the token-level retrieval function (e.g., using a standard information retrieval ranking function that estimates the relevance of documents in a given search query).

Regarding negative augmentation, earnings call transcript sentences were replaced with negatively-related news content of top-ranked TracIn+ scores, and it was checked if the predicted label was flipped. As a result, these perturbed examples were found to provide opposite predictions to the groundtruth, which counterfactually showcases the importance of perturbed sentences. After ranking the earnings call transcript sentences by TracIn+ scores, it was observed that earnings call transcript statements which reflect positive expectations on company performance may largely account for its upward market trend. By masking this piece of information, it was found that the model prediction is flipped, showing that the present MSCA framework can counterfactually quantify the degree of market-topic relevance and task-based salience for earnings call transcript saliency modeling, which helps discover the decision-influencing earnings call texts as post-hoc interpretations.

It was also found that out-of-domain semantics such as greetings like "Hello" and "How are you" exert minor impacts on model predictions when being positively or negatively perturbed. This again certifies that salient domain-related earnings call content is the key ingredient that may influence the price movement of the stock of a company near its earnings call announcement date.

Additional implementation details of the experimental setup are now provided. The learning rate of E-MSCA was set to $1\times10^{-5}$, the batch size was set to 64, the dimension d of all latent representation vectors was set to 512, the dropout rate was set to 0.2, the maximal sentence length of earnings call (EC) L was set to 500, the number H of sparse self-attention heads in $[\cdot]_{HS}$ function was set to 8, the weight decay $\gamma$ was set to 0.01, the number $N_c$ of randomly-chosen external sentences was set to 10000, the number $N_t$ of top-ranked sentences used for topic classifier was set to 10, and the hyperparameter $\alpha$ in $\mathcal{L}_{KL}$, was set to 0.3. The topic-related perturbation method was used where, for each earnings call transcript sentence, the quantities $k_p$, $k_n$ of positively and negatively perturbed data were set to 1. Inside Equation 2 above, the number of top queries to be considered in SP($\cdot$) was set to 10, i.e., the average number of important sentences manually found in each earnings call transcript. Also, the activation function in SP($\cdot$) was set to be Parametric ReLU. Domain experts defined 221 unique topics. Some illustrative, non-limiting topic examples are provided in table 1400 of FIG. 14.

An exemplary methodology 1500 for training the topic classifier 502 is provided in FIG. 15, and an exemplary methodology 1600 for unsupervised counterfactual augmentation is provided in FIG. 16. A text-retrieval algorithm BM25 is also introduced, which is a bag-of-words retrieval function that ranks the (earnings call) documents based on the exact appearance of topic terms:

$$\text{score}(E, T) = \sum_{i=1}^{|T|} \frac{3 \cdot IDF(t_i) \cdot f(t_i, E)}{f(t_i, E) + 2 \cdot \left(0.25 + 0.75 \cdot \frac{|E|}{avgl}\right)}, \quad (8)$$

where $f(t_i,E)$ is the term frequency in the earnings call transcript, and $|E|$ is the length of the earnings call transcript in words. Topic query T consists of $|T|$ topic terms, i.e., $T=\{t_1, \ldots, t_{|T|}\}$, and avgl is the average word length of the earnings call transcript within the entire set $\varepsilon$.

$$IDF(t_i) = \ln\left(\frac{M - n(t_i) + 0.5}{n(t_i) + 0.5} - 1\right),$$

where $n(t_i)$ denotes the number of ECs containing $t_i$.

Table 1700 shown in FIG. 17 summarizes Macro-F1 performance of E-MSCA together with all baseline processes on the three above-described datasets. Similar to table 900 in FIG. 9 (described above), E-MSCA achieves the best performance on all nine sub-datasets across two different time spans.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A system for long-document based prediction, comprising:
   an encoder for creating embeddings of long-document texts with hierarchical sparse self-attention, and making predictions using the embeddings of the long-document texts, wherein the hierarchical sparse self-attention comprises multiple stacked layers of multi-head sparse self attention and one-dimensional convolutional filters with parameterized activation functions to capture long-range sentence-level dependencies; and wherein the encoder implements a sparsity matrix to filter out trivial attention weights and enable focus on attentively important sentences; and
   a multi-source counterfactual augmentation module for generating perturbed long-document texts using unlabeled sentences from at least one external source to train the encoder,
   wherein the multi-source counterfactual augmentation module enforces both semantic alignment through topic classification and task alignment through influence function scoring, and wherein a semi-supervised training protocol is used that alternates between supervised learning of the encoder and augmentation using multi-source data through multiple rounds until convergence, with each round comprising forty epochs of supervised encoder training followed by forty epochs of augmentation training, and wherein a bidirectional Kullback-Leibler (KL) regularization component is introduced to reduce model overfitting by enforcing consistency between output distributions of different sub-models generated by dropout, with a hyperparameter a controlling the weight of the KL divergence terms.

2. The system of claim 1, wherein the long-document texts comprise more than 500 sentences.

3. The system of claim 1, wherein the long-document texts comprise earnings call transcripts, and wherein the embeddings comprise embeddings of the earnings call transcripts.

4. The system of claim 3, wherein the encoder comprises a predictor with a fully-connected layer for predicting a significance level of market volatility over n-days following an earnings call using the embeddings of the earnings call transcripts.

5. The system of claim 3, wherein the at least one external source comprises financial news.

6. The system of claim 1, wherein the multi-source counterfactual augmentation module comprises a topic classifier for identifying salient sentences in the long-document texts for perturbation; and linking the salient sentences in the long-document texts to the unlabeled sentences from the at least one other source through topics.

7. The system of claim 6, wherein the multi-source counterfactual augmentation module comprises an unsupervised counterfactual augmentation module for replacing one of the salient sentences of the long-document texts with one of the unlabeled sentences from the at least one external source as a perturbation, and determining a degree by which the replacing changes the predictions.

8. The system of claim 7, wherein the determining is performed using example-based model explanation.

9. A method for long-document based prediction, the method comprising:
creating, by an encoder, embeddings of long-document texts with hierarchical sparse self-attention, wherein the hierarchical sparse self-attention comprises multiple stacked layers of multi-head sparse self attention and one-dimensional convolutional filters with parameterized activation functions to capture long-range sentence-level dependencies; and wherein the encoder implements a sparsity matrix to filter out trivial attention weights and enable focus on attentively important sentences;
training the encoder using perturbed long-document texts generated by counterfactual augmentation with unlabeled sentences from at least one external source, wherein the multi-source counterfactual augmentation module enforces both semantic alignment through topic classification and task alignment through influence function scoring, and wherein a semi-supervised training protocol is used that alternates between supervised learning of the encoder and augmentation using multi-source data through multiple rounds until convergence, with each round comprising forty epochs of supervised encoder training followed by forty epochs of augmentation training, and wherein a bidirectional Kullback-Leibler (KL) regularization component is introduced to reduce model overfitting by enforcing consistency between output distributions of different sub-models generated by dropout, with a hyperparameter a controlling the weight of the KL divergence terms; and
making predictions, by the encoder, using the embeddings of the long-document texts.

10. The method of claim 9, wherein the long-document texts comprise more than 500 sentences.

11. The method of claim 9, wherein the long-document texts comprise earnings call transcripts, and wherein the embeddings comprise embeddings of the earnings call transcripts.

12. The method of claim 11, further comprising:
predicting a significance level of market volatility over n-days following an earnings call using the embeddings of the earnings call transcripts.

13. The method of claim 11, wherein the at least one external source comprises financial news.

14. The method of claim 9, further comprising:
identifying salient sentences in the long-document texts for perturbation; and
linking the salient sentences in the long-document texts to the unlabeled sentences from the at least one other source through topics.

15. The method of claim 14, further comprising:
replacing one of the salient sentences of the long-document texts with one of the unlabeled sentences from at least one other source as a perturbation.

16. The method of claim 15, further comprising:
determining a degree by which the replacing changes the predictions.

17. The method of claim 16, wherein the determining is performed using example-based model explanation.

18. A computer program product for long-document based prediction, the computer program product comprising a computer readable storage medium having program instructions embodied therewith, the program instructions executable by a computer to cause the computer to perform:
creating, by an encoder, embeddings of long-document texts with hierarchical sparse self-attention, wherein the hierarchical sparse self-attention comprises multiple stacked layers of multi-head sparse self attention and one-dimensional convolutional filters with parameterized activation functions to capture long-range sentence-level dependencies; and wherein the encoder implements a sparsity matrix to filter out trivial attention weights and enable focus on attentively important sentences;
training the encoder using perturbed long-document texts generated by counterfactual augmentation with unlabeled sentences from at least one external source, wherein the multi-source counterfactual augmentation module enforces both semantic alignment through topic classification and task alignment through influence function scoring, and wherein a semi-supervised training protocol is used that alternates between supervised learning of the encoder and augmentation using multi-source data through multiple rounds until convergence, with each round comprising forty epochs of supervised encoder training followed by forty epochs of augmentation training, and wherein a bidirectional Kullback-Leibler (KL) regularization component is introduced to reduce model overfitting by enforcing consistency between output distributions of different sub-models generated by dropout, with a hyperparameter a controlling the weight of the KL divergence terms; and
making predictions, by the encoder, using the embeddings of the long-document texts.

19. The computer program product of claim 18, wherein the long-document texts comprise earnings call transcripts, and wherein the embeddings comprise embeddings of the earnings call transcripts.

20. The computer program product of claim 19, wherein the program instructions further cause the computer to perform:
predicting a significance level of market volatility over n-days following an earnings call using the embeddings of the earnings call transcripts.

* * * * *